United States Patent [19]

Bohley et al.

[11] Patent Number: 5,041,831
[45] Date of Patent: Aug. 20, 1991

[54] INDIRECT D/A CONVERTER

[75] Inventors: Thomas K. Bohley; Grosvenor H. Garnett, both of Colorado Springs; Christopher Koerner, Longmont, all of Colo.

[73] Assignee: Hewlett-Packard Company, Palo Alto, Calif.

[21] Appl. No.: 186,311

[22] Filed: Apr. 26, 1988

[51] Int. Cl.⁵ .............................................. H03M 1/66
[52] U.S. Cl. .................................... 341/144; 341/120
[58] Field of Search ................. 341/53, 143, 144, 147, 341/152, 120

[56] References Cited

U.S. PATENT DOCUMENTS 4,065,765  12/1977  Wagner ................................. 341/53
4,636,773  1/1987  Lewis et al. ......................... 341/127

OTHER PUBLICATIONS

H. Schmid, Electronic Analog Digital Conversion, Van Nostrand Reinhold, N.Y., 1970, chapter 7, pp. 165–229.

Primary Examiner—William M. Shoop, Jr.
Assistant Examiner—Brian K. Young
Attorney, Agent, or Firm—Karl E. Bring

[57] ABSTRACT

A plural channel indirect digital to analog converter. Words containing address bits and data bits are received on an input and entered into a specific one of the converter channels under control of the address bits of the word. The data bits are applied to a binary rate multiplier of the channel which generates a pulse modulated output signal representing the binary value of the received data bits. The pulse modulated output signal is applied to an associated filter which converts the pulse modulated signal to an analog output signal whose amplitude represents the binary value of the received data bits. Gating circuitry ensures that each output pulse is of a precisely controlled pulse width. One of the converter channels is used to calibrate the output level of the filters. The number of data bits applied to the different channels may need not be the same and may vary in number from a minimum of 1 to a maximum of m.

39 Claims, 8 Drawing Sheets

INDIRECT D/A CONVERTER

RELATED APPLICATION

This application is related to a concurrently filed application Ser. No. 07/186,430 by the same named inventors and entitled "Combined Rate/Width Modulation Arrangement" now U.S. Pat. No. 4,940,979.

FIELD OF THE INVENTION

This invention relates to a digital to analog converter and more particularly to a plural channel digital to analog converter.

BACKGROUND OF THE INVENTION

Digital to analog (D/A) converters are well known and are used to convert digital signals representing information into analog signals representing the same information. In instrumentation devices, D/A converters are used to convert received digital signals into analog signals that are applied to the internal circuitry of the instrument to effect a system or device function represented by the received digital signal. A single instrument may use a plurality of D/A converters to control a corresponding plurality of device functions. Although D/A converters are currently available in many different configurations and types, modern instrumentation technology imposes a set of constraints and requirements that is not met by the currently available D/A converters. As mentioned, a single instrument may require the use of a plurality of D/A converters. Since space is often at a premium in instruments, the required plurality of D/A converters must occupy a minimum of space. This leads to the requirement that the plurality of required D/A converters should be on a single chip rather than comprise a plurality of discrete devices.

The plurality of D/A converters in an instrument need not be necessarily of the same type since the different converters will control different device functions. Some of these functions are complex. Others are relatively simple. A first D/A converter may control a complex function by generating an analog output signal having a large number of discrete steps. This may require the use of a 16 bit D/A converter in order to provide 65536 different levels in the output signal. Another converter may need only generate an output signal having 256 different amplitudes. In this case, an 8 bit converter may be used. Still another converter may perform a relatively simple function such as a "yes or no" or an "on/off" function. In this case, a one bit converter would be adequate. The need for converters that operate from data words of different bit sizes has heretofore required the use of different A/D converter devices. This increases the cost and complexity of the instrument design.

Current day state-of-the-art instrumentation requires extremely close tolerances on output voltages and other specifications of the signals operating the instrument. This requires that the D/A converters provide output signals that have a correspondingly close tolerance on the amplitude of the output signals as well as the signal duration.

Although many different types of D/A converters are currently available, none is available that meets all of the above characterized requirements. D/A converters are primarily available as discrete devices and not on chips containing a plurality of converters. There are no D/A converters capable of operating with input signals containing different numbers of data bits such as 1 bit, 4 bits, 8 bits, 16 bits, etc.

It may be seen in view of the above that although D/A converters are well known and extensively used, it is a problem to use the currently available converters in state of the art instrumentation in a manner that meets all of the above requirements.

SUMMARY OF THE INVENTION

The present invention solves the above problem and achieves a technical advance by providing a multi-channel D/A converter that meets the requirements of current day instrumentation. The provided D/A converter embodies a plurality of converters on a single chip with the different converters being capable of being operated by digital input signals having differing numbers of bits. The provided converter may respond to digital signals containing anywhere from 1 data bit per signal to 16 data bits per signal for a system having a bit capacity of 16 data bits per word. If desired, more than 16 data bits per word may be used if a converter having still higher granularity is required and if the system hardware is adapted to accept the larger data words. Each input word received by the converter chip contains both address bits and data bits. The address bits are used to specify the channel, i.e. a specific one of the 16 converters on the chip. The data bits of a word represent the digital signal that is to be applied to the converter specified by the address bits.

The D/A converter of the present invention is of the indirect type. This means that the converter receives a binary pattern of data bits, processes the bits and generates an output signal comprising a series of pulses modulated in accordance with the binary value of the bits. The modulated output pulses are applied to an integrating filter associated with the converter to derive an analog output signal having a number of steps whose amplitude equals to the binary value of the data bits. For example, assume that a 1 bit digital signal is processed by a first D/A converter on the chip and that the analog output signal of the filter can vary between 0 and 2.5 volts for a system having a maximum output of 5 volts when 16 data bits are received. In this case, the output signal of the filter will be 0 volts for a binary input of 0 and 2.5 volts for a binary input signal of 1. The expression for the maximum output voltage for 1 bit data words in a system having a 5 volt maximum for 16 bit data words is:

$$V = 5 \times \frac{2^{15}}{2^{16}} = 2.5 \text{ volts}$$

If another D/A converter operates with a 16 bit input signal, the output of the filter associated with the last mentioned converter will vary between 0 and 5 volts in 65,536 different increments. This equals 76.2 microvolts per step. Similarly, if another D/A converter operates with an 8 bit input signal, the output of the associated filter will vary between 0 and 4.98 volts in 256 different steps with each step being 19.5312 millivolts in amplitude. The expression for the maximum output voltage available from 8 bit data words in a system having a 5 volt maximum for 16 bit data words is:

$$V = 5 \times \frac{(2^{15} + 2^{14} + 2^{13} + 2^{12} + 2^{11} + 2^{10} + 2^9 + 2^8)}{2^{16}}$$

The foregoing description assumes that the filters are non-inverting, have unity gain and no offset. Other filters can be used, if desired. Thus, the maximum voltage from the filter is dependent upon the bit count of the input signal.

The pulsed output signal of the converter permits the use with a relatively simple and inexpensive two pole filter. This output signal comprises a stream of pulses with the number and/or the width of the pulses generated in response to each input signal being dependent upon the binary value of the data bits in the input signal. If only the least significant bit (LSB) of the word (bit 0) is a 1, the output signal stream consists of a one narrow pulse per word period. If the input signal is a 1 only in the next higher bit (a binary 2), an output signal is generated having 2 two narrow pulses per word period. Similarly, an input signal having a 1 in only the third order bit (a binary 4), generates an output signal having 4 narrow pulses. A signal having only bit 8 high (binary 256) generates an output signal having 256 narrow pulses. In other words, the receipt of data words having binary values between the range of 0 and 256 generates output signals having a number of narrow pulses equal to the binary value of the lower order 8 bits (bits 0 - - - 7) of the received binary word. This is termed "rate modulation."

Input signals whose data bits have a binary value greater than 256 generate output signals having pulses that are both rate and width modulated. Each different pattern of received data bits generates an output signal having a plurality of pulses that are unique with respect to the number of pulses generated and/or the width of the pulses. This type of modulation is advantageous in that it reduces the requirements on the filter that receives the pulsed output signal and converts it to an analog signal. If only rate modulation were used, the output signals generated would vary from 1 pulse for a 1 bit word to 65536 pulses for a 16 bit word. The disadvantage of this type of modulation is that it contains high frequencies which can produce noise signals at the output of the filter. It also, statistically, can result in one or more of the pulses not having the same energy level or amplitude. This would affect the amplitude of the analog output signal generated by the filter so that the resultant output signal would not then be of the precise amplitude specified by the input signal. On the other hand, if pure width modulation were used, the filter would have to handle low frequencies which are more difficult to filter than are high frequency signals. These low frequencies would require the filter to either be more complex and/or bulkier than is the case for the present design. The use of combined rate and width modulation for the digital portion of the converter of the present invention permits the use of a relatively simple filter which receives the generated rate/width modulated pulses and convert them into amplitude modulated signals.

It has already been mentioned that high quality instrumentation requires precise tolerances of the signals used in the instrument. This is achieved in the present invention by the use of D/A converters that generate output signals having precise voltages. For example, if it is desired that the output signal of each filter vary between precisely 0 and 5 volts it is necessary that the 5 volt upper amplitude of the signal be accurate within a few microvolts. It is also necessary that the 0 volt reference have the same degree of accuracy. This is achieved by the present invention by the use of one or more of the D/A converters for stabilizing the voltages that generate the 5 volt upper limit and the 0 volt lower limit of the filters.

Each of the plurality of D/A converters on the chip can operate in response to digital signals having different numbers of data bits. For example, one converter can operate upon the reception of a 1 bit data signal. Another can operate from the reception of a 2 bit signal and so on up through a maximum of 16 bits for a system having a maximum bit width of 16. This aspect of the invention is advantageous in that a single chip containing a plurality of identical D/A converters can be used in a single instrument to provide different functions with each function being controlled by the reception of a data word having only the number of bits required to achieve the desired function. Thus, if a function is a simple on and off function, a simple 1 bit data word may be applied to a first converter to generate a two step analog output signal that has either a 0 or a 2.5 volt amplitude depending upon the binary value of the 1 bit input signal. Another converter on the same chip can operate in response to the reception of 16 bit data words to generate an output analog signal having 65536 discrete steps between 0 and 5 volts to control a instrument function requiring an analog signal of this granularity. Others of the converters can operate in response to the reception of input signals having other numbers of bits between 0 and 16 bits.

In summary, the plural channel converter of the present invention meets the requirements of high quality instrumentation. It comprises 16 different converters on a chip each of which operates in response to the reception of a data word having a plurality of address bits and one or more data bits. The number of data bits in a word is dependent upon the system function controlled by the word and the granularity required in the output signal generated by the converter. The different converters of the chip can operate in response to the reception of input words having differing numbers of data bits. This avoids the need that the different D/A converters be custom selected in accordance with the bit width of the input signals that may be received.

BRIEF DESCRIPTION OF THE DRAWING

The above and other advantages of the invention may be better understood from a reading of the following description thereof taken in conjunction with the drawing in which.

DETAILED DESCRIPTION

Figure 1:
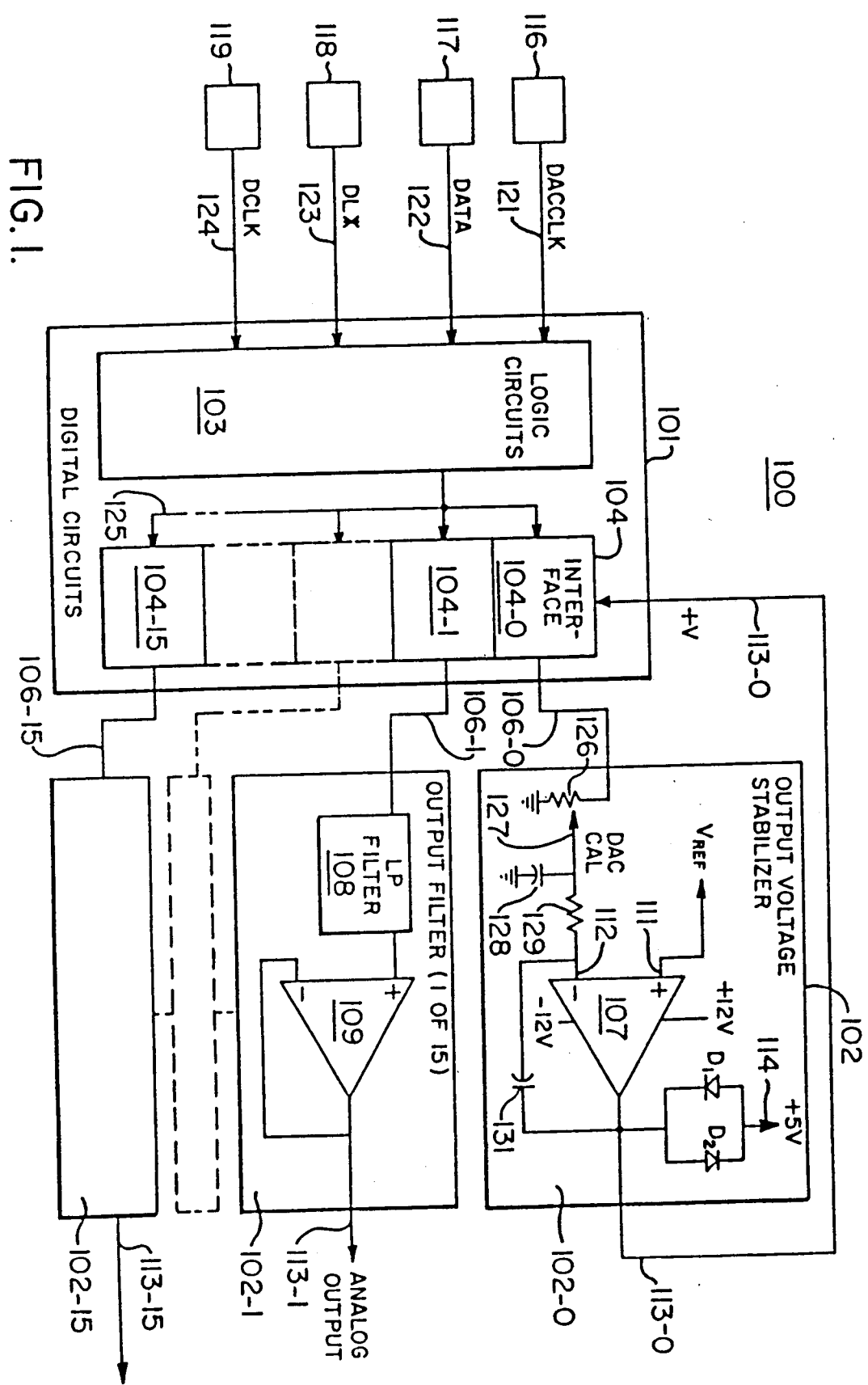
FIG. 1 illustrates the invention in block diagram form.

Description of FIG. 1

FIG. 1 discloses the plural channel D/A converter of the present invention as comprising digital circuit 101, output voltage stabilizer 102-0 and output filters 102-1 through 102-15. The digital circuits 101 comprises logic circuits 103 and interface 104 having 16 sections designated 104-0 through 104-15.

Signal sources 116 through 119, respectively, apply signals over conductors 121 through 124, respectively, to the inputs of logic circuits 103. Element 116 applies a refresh clock signal (DACCLK) to conductor 121. Element 117 applies DATA words containing address and data bits to conductor 122. Element 118 applies data latch signals (DL*) to conductor 123 and element 119 applies data load clock signals (DCLK) to conductor 124.

Figure 2:
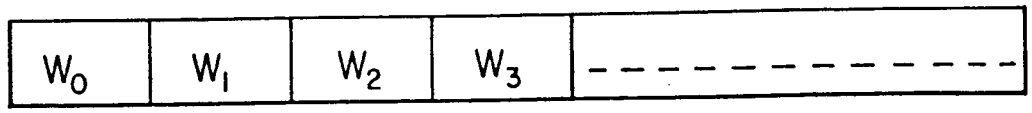
FIGS. 2, 3 and 4 illustrate further details of the input signals applied to the converter of FIG. 1.
Figure 3:
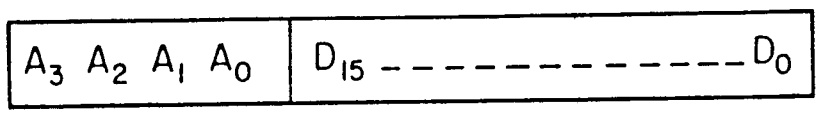
Figure 4:
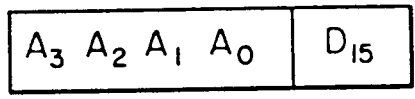
Figure 13:
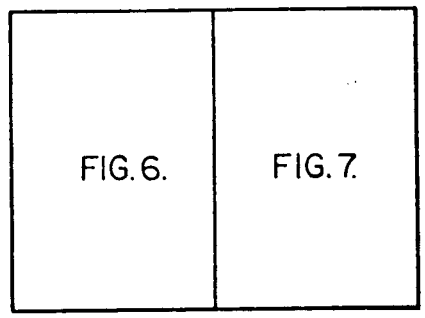
FIG. 13 shows how FIGS. 6 and 7 should be arranged.

FIGS. 2, 3 and 4 disclose data words of the type that element 117 generates and applies sequentially to lead 122. This is shown on FIG. 2 by words W0, W1, W2, W3 etc. The words of FIG. 2 may have bit patterns as shown on FIGS. 3 and 4. FIG. 3 discloses the bit pattern of a word having 16 data bits. FIG. 4 discloses the bit pattern of a word having 1 data bit. The word of FIG. 3 has four address bits A0, A1, A2 and A3 followed by the 16 data bits designated D0 through D15. FIG. 4 discloses a 1 bit data word having four address bits and one data bit designated D15. Other words having differing quantities of data bits may be applied to lead 122 with the possible range of data bits for the data words not shown extending from 2 to 15. The number of bits in a word is dependent upon the system function to be controlled by the word. As priorly mentioned, a relatively simple on/off function may be controlled by the 1 bit data word of FIG. 4 while a complex function may be controlled by the 16 bit data word of FIG. 3.

The words that are sequentially received as shown on FIG. 2 need not have any functional relationship to each other. For example, word W0 may be directed to any one of the 16 channels of the disclosed D/A converter in accordance with the value of the A— address bits in the word. Word W1 may have the same address as does word W0 and would then be directed to the same converter channel. Alternatively, word W1 may be directed to any of the other 15 channels. Word W2 may be directed to the same channel as words W0 or W1, or it may be directed to a different channel. Similarly, all of the words of FIG. 2 may be directed to the same converter channel and in this case, they will have the same address bits. Alternatively, they could all be directed to different channels and in this case each would have different address bits. In short, there is no required relationship between the plurality of words generated by element 117 and applied over conductor 122 to logic circuits 103.

Logic circuits 103 have 16 sections, one for each of the possible 16 addresses that can be specified by the four A— bits of a received word. The address and data bits of a word are entered sequentially into a common shift register, bit by bit, in logic circuits 103 under control of data load clock signals (DCLK) applied to conductor 124. After all bits of a word have been entered into the shift register, the data bits are latched from the shift register into the appropriate section of a latch under control of the address bits and by the latch signal (DL*) on conductor 123.

The data bits stored in the latch are converted from binary to a combined rate/width modulated pulse signal that are applied over conductors 125 to interface 104. Interface 104 has 16 sections each of which is associated with one of the sections of logic circuits 103. Thus, interface section 104-0 is associated with the section of circuits 103 that is specified by an address of 0 for the A-bits. Interface section 104-15 is associated with the section of circuits 103 specified by A-address bits having a binary value of 15. The rate/width modulated signal applied to a section of interface 104 is applied out from the interface over the corresponding one of output leads 106-0 through 106-15 which extend to a corresponding one of elements 102-0 through 102-15. Filter elements 102-1 through 102-15 each filter a rate/width modulated signal on an associated path 106- and convert each such signal into a corresponding analog output signal. The output signal generated by filters 102-1 through 102-15 are applied to the associated ones of output conductors 113-1 through 113-15.

Element 102-0 is an output voltage stabilizer which receives a rate/width modulated signal on path 106-0 and uses it to control the value of the +V potential applied by path 113-0 to the upper input of interface 104. The signal on path 106-0 is applied to the upper input of potentiometer 126. Tap 127 on the potentiometer extends the signal through RC circuit 128 and 129 to the lower input 112 of comparator 107. The upper input 111 of comparator 107 receives a precision voltage reference signal (VREF). VREF is a fixed voltage reference that can fall between +1 volt and +4 volts. Comparator 107 holds its output on path 11300 near +5 volts. The diodes D1 and D2 are clamps that prevent the potential on path 113-0 from differing from 5 volts in either direction by more than the drop of a diode at initial power up of the circuit.

At setup time when the system is initialized, tap 127 of the potentiometer is adjusted so that the output on path 113-1 is precisely 5 volts whenever words having all 1s for the 16 data bits are applied to both channels 0 and 1 of logic circuits 103. This all 1s signal applied to channels 0 and 1 generates a rate/width modulated output signal that is applied over path 125 to segments 104-0 and 104-1 of interface 104. From there, the signals are applied over path 106-0 to the top of the potentiometer 126 whose slider 127 is adjusted so that the output 113-0 is set to approximately 5 volts. It is important that the +V signal on lead 113-0 is precisely regulated at all times in order that the pulsed signal applied to filters 102-1 through 102-15 will have a precisely known value so that, in turn, the maximum value of the analog output signals of 113-1 through 113-15 of the filters may be determined with precision. The all 1's signal applied to channel 1 permits a measurement to be made to verify that the voltage on path 113-1 is 5 volts. This is subsequently described in further detail.

In partial summary of the function of FIG. 1, successive input words are applied to lead 122. The data bits of each word are steered into the appropriate section of logic circuits 103 under control of the A— address bits in each word. The data bits of each word are converted into a rate/width modulated pulse signal by logic circuits 103 and extended through an associated section of interface 104 to the associated one of conductors 106-0 through 106-15. The rate/width modulated pulses are applied to either the output voltage stabilizer 102-0 over path 106-0 or to one of filters 102-1 through 102-15 over paths 106-1 through 106-15. The signals received by the filters are converted to analog signals representing the binary value of the associated word received on path 122. The signals on paths 113-1 through 113-15 to perform the system functions associated with each received data word. The signal applied to path 106-0 stabilizes the +V input voltage to interface 104. This voltage is held near 5 volts so that the input signals to the filters and the output signals generated by the filters are held to precisely controlled values.

Assume that signals on paths 113- at the output of filters 102-1 through 102-15 can vary between 0 and 5 volts. Also assume that a word having 16 data bits of all 1s is received. This word is entered into the appropriate section of logic circuits 103, processed by these circuits, applied to interface 104 and appears as a rate/width modulated signal on a path 106-. This signal is received by the associated filter 102- which integrates the modulated signal and produces an analog output signal having a constant amplitude of 5 volts. This 5 volt signal is the maximum output of the filter for a received word on path 122 having a 1 for each of its 16 data bits. For the reception of a received word having all 0s, the filter 102- would generate an output signal having an amplitude of 0 volts. The reception of other words whose data bits have binary values between 0 and all 1s would generate analog output signals representing the value of the received data bits in these other words.

The left side of FIG. 1 shows signal sources 116 through 119 applying signals to conductors 121 through 124. Although elements 116 through 119 are shown as discrete elements, these elements could, if desired, comprise a microprocessor operating under program control to generate all of the signals required by conductors 121 through 124. FIG. 1 shows elements 116 through 119 as discrete devices to simplify and facilitate an understanding of the invention. It is to be understood that the invention may also be practiced by using a single program control led microprocessor to perform all the functions of elements 116 through 119.

Figure 5:
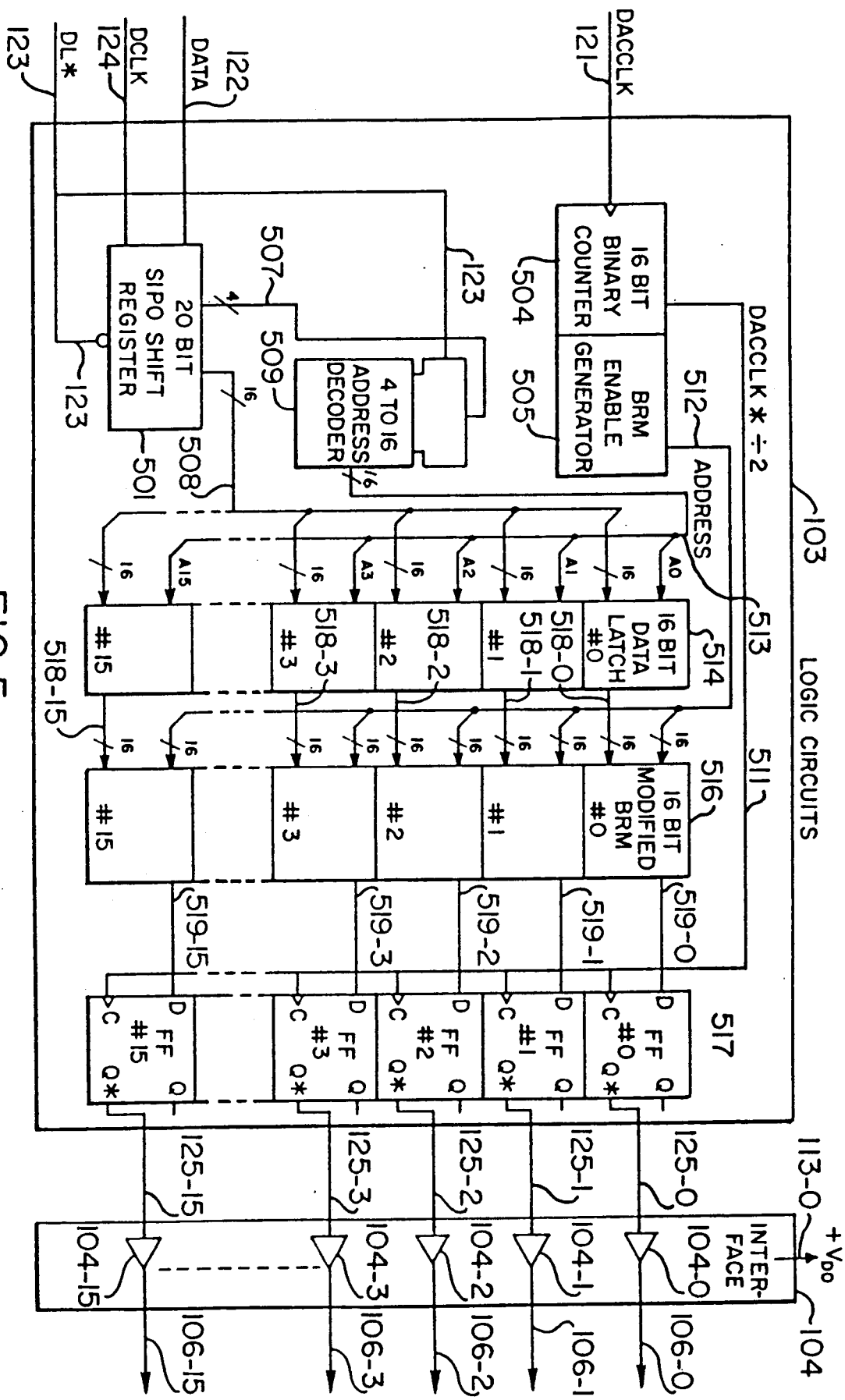
FIG. 5 illustrates further details of the digital circuits of FIG. 1.

Description of FIG. 5

FIG. 5 discloses further details of logic circuits 103 and interface 104 of FIG. 1. Input conductors 121 through 124 are shown on the left side of FIG. 5. These conductors apply the same signals to logic circuits 103 as described in connection with FIG. 1. The data refresh clock signal (DACCLK) is applied over conductor 121 to a 16 bit binary counter 504. DATA words are applied over conductor 122 to the upper input of shift register 501. Data load clock signals (DCLK) are applied over conductor 124 to the lower left input of shift register 501. The data latch signal (DL*) is applied over conductor 123 to the bottom input of shift register 501. The data latch signal is also applied over conductor 123 to the left input of the 4 to 16 address decoder 509.

Logic circuits 103 further comprise a sixteen section 16 bit data latch 514, a sixteen section 16 bit modified binary rate multiplier (BRM) 516, and 16 flip flops 517.

The function of these circuits is subsequently described in detail.

Data words, of the type shown on FIGS. 3 and 4 are applied over conductor 122 to the top left input of shift register 501. A data load clock signal (DCLK) is applied to path 124 as each bit of a word is applied over path 122 to the upper left input of shift register 501. Each DCLK signal clocks into shift register 501 the bit that is concurrently received on conductor 122.

Figure 9:
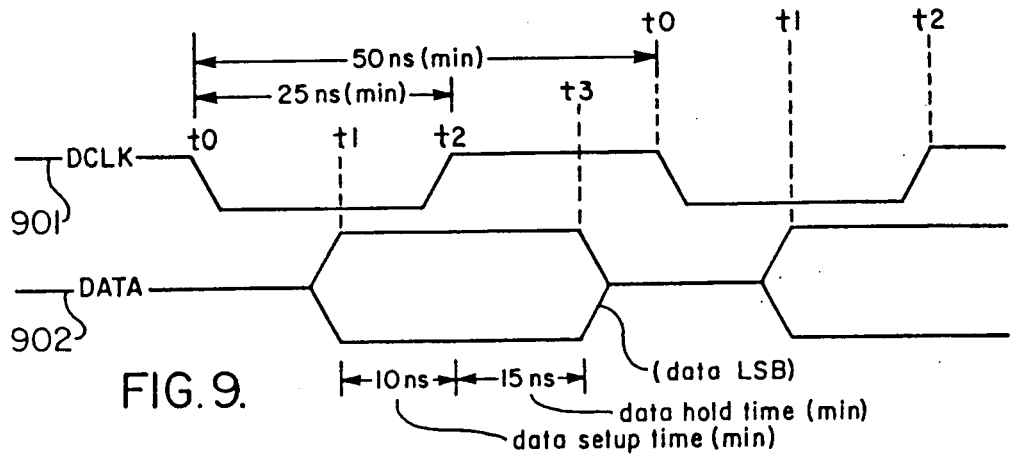
FIGS. 9, 10 and 11 are wave forms illustrating the relationship between and characteristics of the input data signal, the latch signal and the clock signal applied to the converter of FIG. 1.

FIG. 9 shows the relationship between the DATA pulses and the DCLK pulses. A data pulse is shown on line 902 and a DCLK pulse is shown on line 901 of FIG. 9. A data pulse on line 902 may be either positive or negative going depending upon whether the data bit represented by the pulse is a binary 1 or a binary 0. A data pulse is 25 nanoseconds minimum in duration. The DCLK pulse data clock on line 901 precedes the data pulse by at least 10 nanoseconds. Each rising edge of a DCLK pulse shifts the associated data pulse serially into shift register 501.

On line 901, the DCLK pulse has a negative transition at time t0. The data pulse may have either a positive or a negative transition at time t1 depending upon the bit value represented by the pulse. The DCLK pulse has a rising transition at time t2 which clocks the associated data pulse on line 902 into shift register 501. The process then repeats, the next DCLK pulse has a negative transition at the next time t0 on FIG. 9 and a positive transition at the next t2 time which clocks in the next pulse on line 902.

The leftmost data pulse on line 902 may be assumed to be the first bit of a received data word. In this case, it is the least significant bit (LSB) of the word. This is the LSB data bit.

The maximum clock rate of the DCLK pulse is 20 megahertz and the duty cycle is 50 per cent. A DCLK pulse is generated only when a bits is applied to path 122. The DCLK signal rests in the high state after all bits of a word are shifted into register 501. This is shown on line 1001 of FIG. 10. The last bit of a word shifted in is the most significant bit (MSB) of the address. Since shift register 501 is cleared after each readout of the shift register, fewer than 16 data bits may be used to represent a received data word. The circuitry of FIG. 5 operates as an N bit digital to analog converter where N equals or is less than 16 if less than 16 data bits for a word are received. The MSB of the data field of a word is always followed by four A+ address bits as shown on FIGS. 3 and 4.

Figure 10:
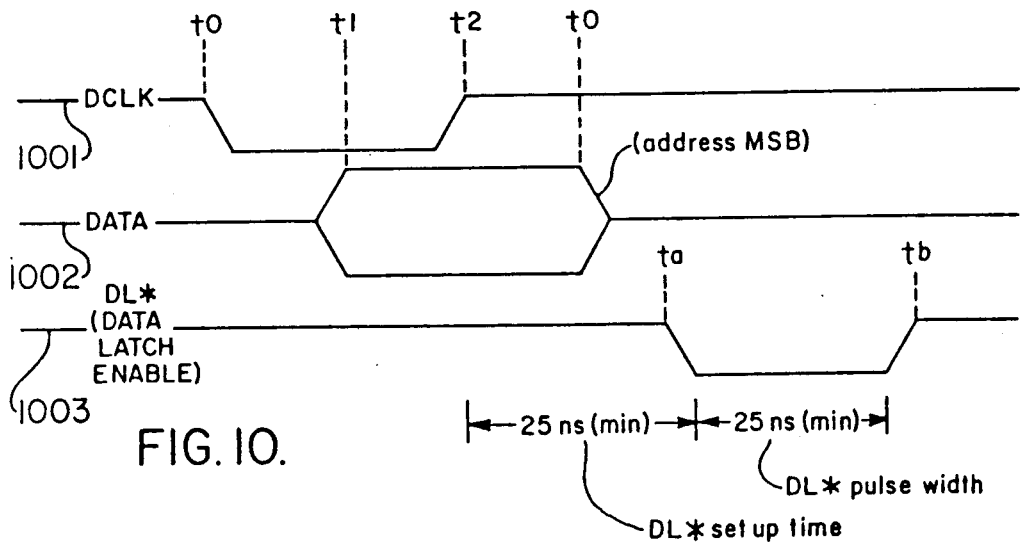

FIG. 10 discloses the relationship between the DCLK pulse on line 1001, the last received bit of a word (the MSB of the address) on line 1002, and the DL* (data latch enable) pulse on line 1003. The DCLK pulse on line 1001 has a negative going transition at time t0. The last received bit (the MSB address bit) on line 1002 has its first transition at time t1. At time t2, the positive going transition of the DCLK pulse clocks the bit on line 1002 into shift register 501. The DL* pulse on line 1003 has a negative going transition at time ta which is approximately 25 nanoseconds after time t2. The positive going transition of the DL* pulse at time tb effects a readout of the shift register and, at this time, the bits that are in the shift register are applied out in parallel over paths 507 and 508. Path 507 receives the four A— address bits. Path 508 receives the D— data bits. For a received word having 16 data bits, path 508 receives 16 parallel data bits.

The four A— address bits are applied over path 507 to decoder 509 which generates a 1 out of 16 output signal to activate the one conductor of the 16 comprising path 513 that is associated with the section of latch 514 into which the data bits from shift register 501 are to be entered. Concurrently with the activation of this one conductor of path 513, the data bits in shift register 501 are applied over path 508 to the inputs of all 16 sections of latch 514. However, the only section of latch 514 that registers the data bits on path 508 is the one section that is specified by the address bits on path 507.

Figure 11:
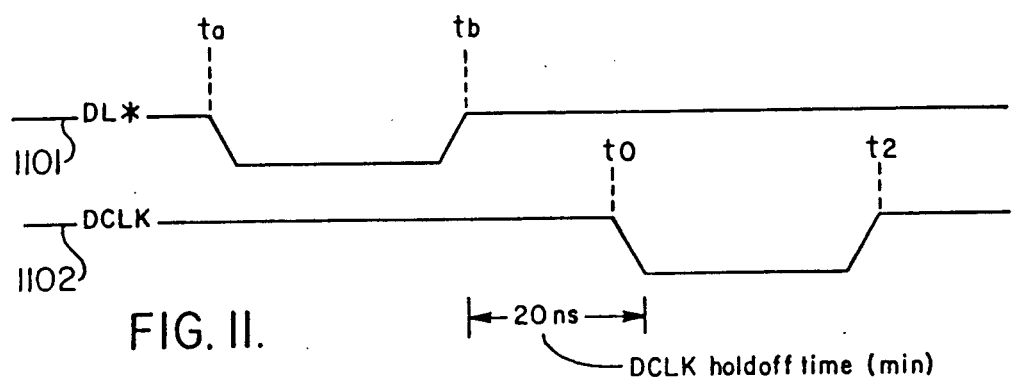

The rising edge of the DL* signal on lines 1003 and 1102 at time tb, prepares shift register 501 to be cleared by the next falling edge of the DCLK pulse. The DL* signal rests in a high state as shown on FIG. 11 after the data bits of a word are read out of shift register 501 at time tb. In normal operation, the DL* signal and the DCLK signal are never low at the same time. The minimum width of the DL* signal on lines 1003 and 1101 is 25 nanoseconds. The resetting of the shift register is subsequently effected by the falling edge of the DCLK signal on line 1102 at time t0. This occurs when the LSB of the next word is received on path 122.

In summary of the operation of the data loading operation of the circuitry of FIG. 5, a data word is received in a serial format on path 122 and entered into shift register 501 under control of DCLK pulses on path 124. The bits of the word are subsequently read out of the shift register 501 in parallel by the DL* signal applied to path 123. This enters the readout data bits into one of the sections of latch 514 under control of decoder 509 and the four A— address bits of the word.

Figure 8:
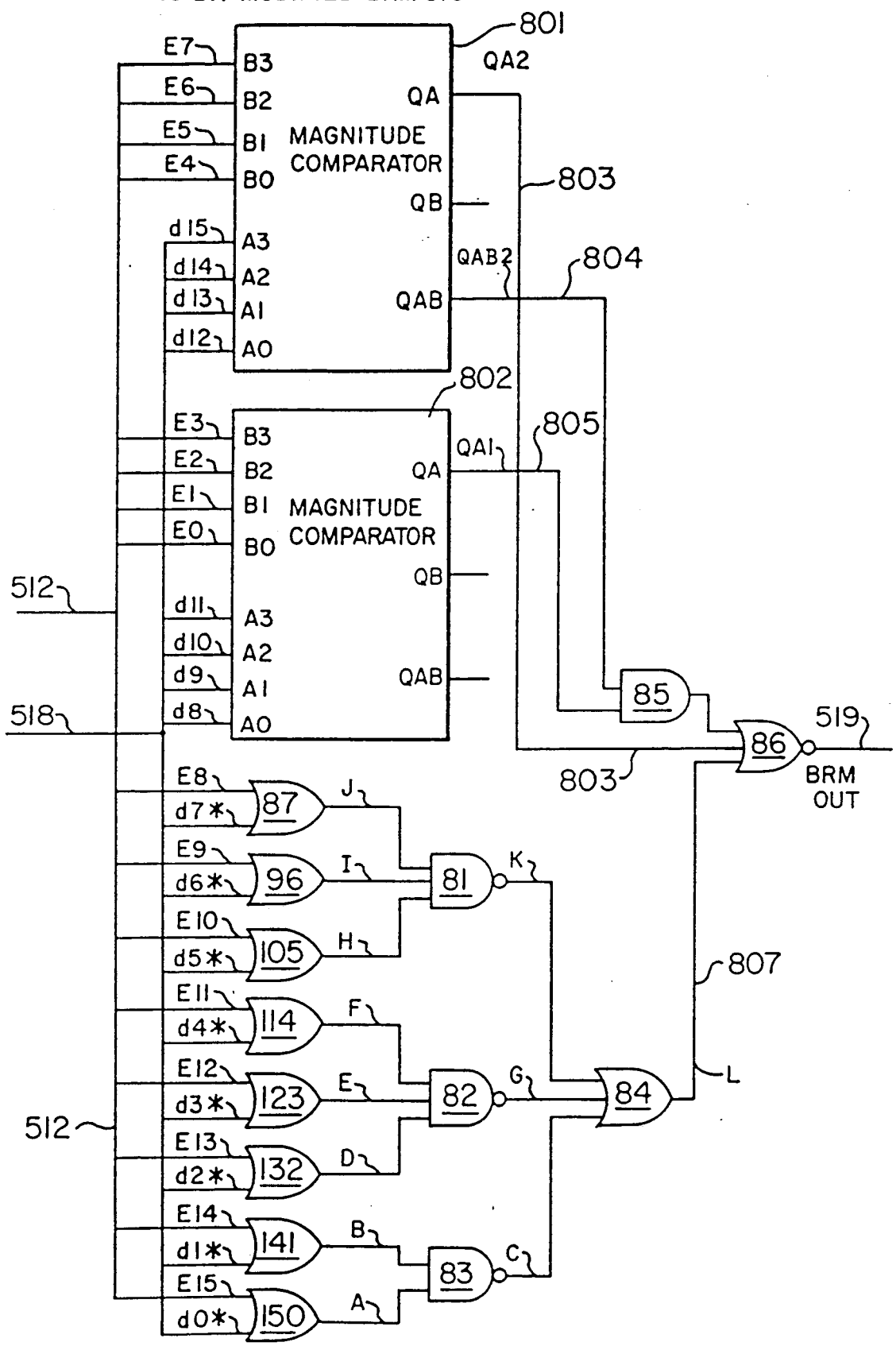
FIG. 8 discloses further details of the modified binary rate multiplier of FIG. 5.

The information stored in a section of data latch 514 is continuously applied by the section over its associated output path 518 to its associated section of the 16 bit modified BRM (binary rate multiplier) 516. BRM 516 has a section individual to each of the 16 sections of latch 514. FIG. 8 discloses further details of a section of BRM 516. Since the BRM 516 has 16 sections, the entire BRM 516 comprises 16 individual circuits of the type shown on FIG. 8.

Description of FIG. 8

The circuitry of FIG. 8 may be divided into upper and lower portions with the lower portion comprising a plurality of OR gates of which gate 87 is the top most and gate 150 is the bottom most. The upper portion comprises two magnitude comparators 801 and 802 which are functionally similar to Texas Instrument SN 5485 and SN 7485 type devices. The upper 8 data bits (D8 through D15) of path 518 from latch 516 are applied to the magnitude comparators. The * or "not" function of the lower most 8 data bits (D0* through D7*) on path 518 is applied to the OR gates on the bottom left part of FIG. 8. These OR gates also receive over path 512 the upper 8 enable pulses (E8 through E15) generated by the BRM enable generator 505. The magnitude comparators 801 and 802 receive the lower 8 enable bits (E0 through E7) on path 512. The outputs of the magnitude comparators are applied to gates 85 and 86. The outputs of the gates in the lower half of FIG. 8 are applied to the lower input of OR gate 86 over conductor 807.

The BRM circuitry of FIG. 8 responds to the coincident reception of data bits from a latch 514 on path 518 and enable bits on path 512 from BRM enable generator 505. In response, it generates a combined rate/width modulated pulse signal that is applied to 519. This signal is modulated in accordance with the binary value of the data bits on path 518 from a latch 514. The details of this signal are subsequently described.

Figure 6:
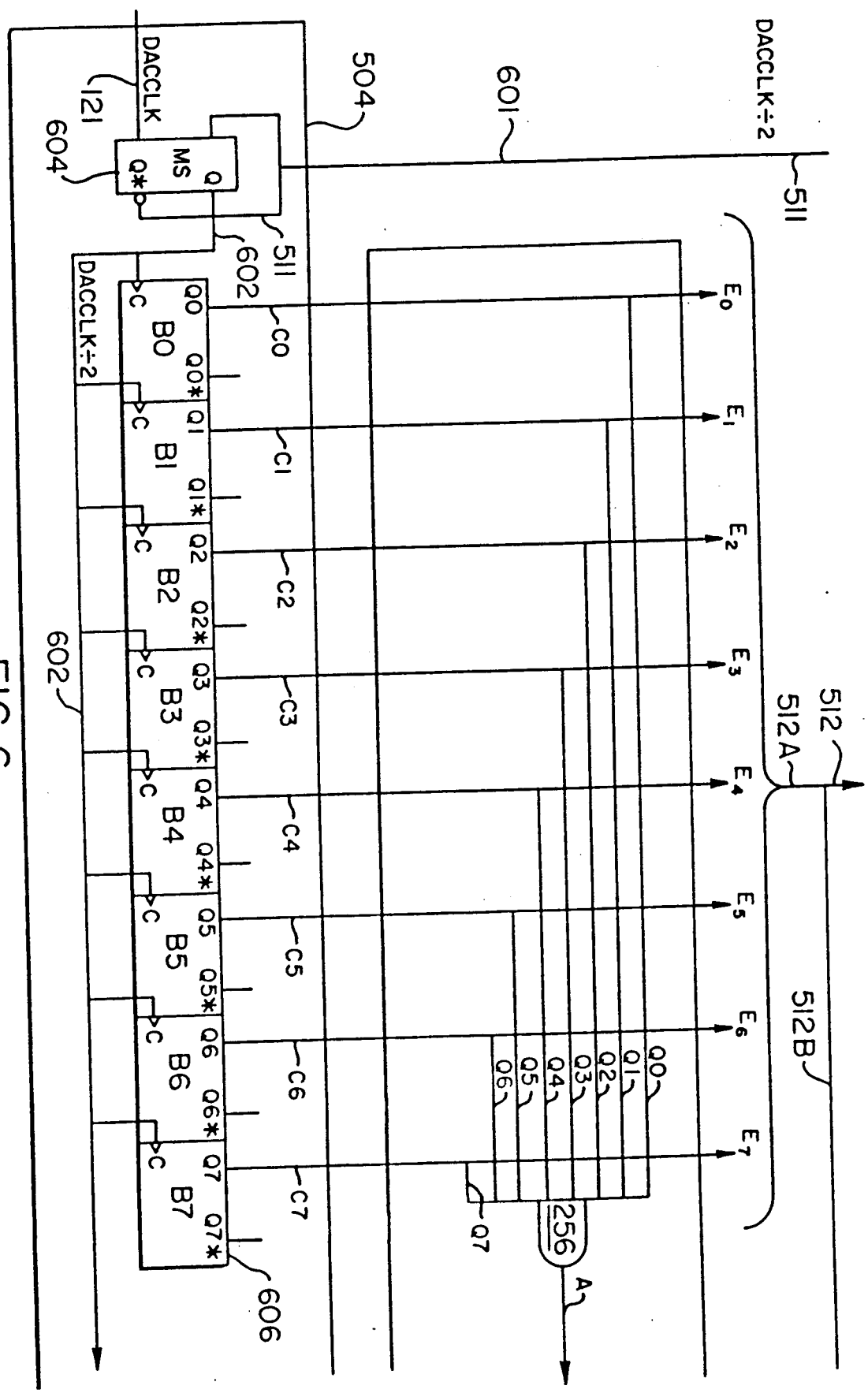
FIGS. 6 and 7, when arranged as shown in FIG. 13, discloses further details of the 16 bit synchronous binary counter and the binary rate multiplier enable generator of FIG. 5.
Figure 7:
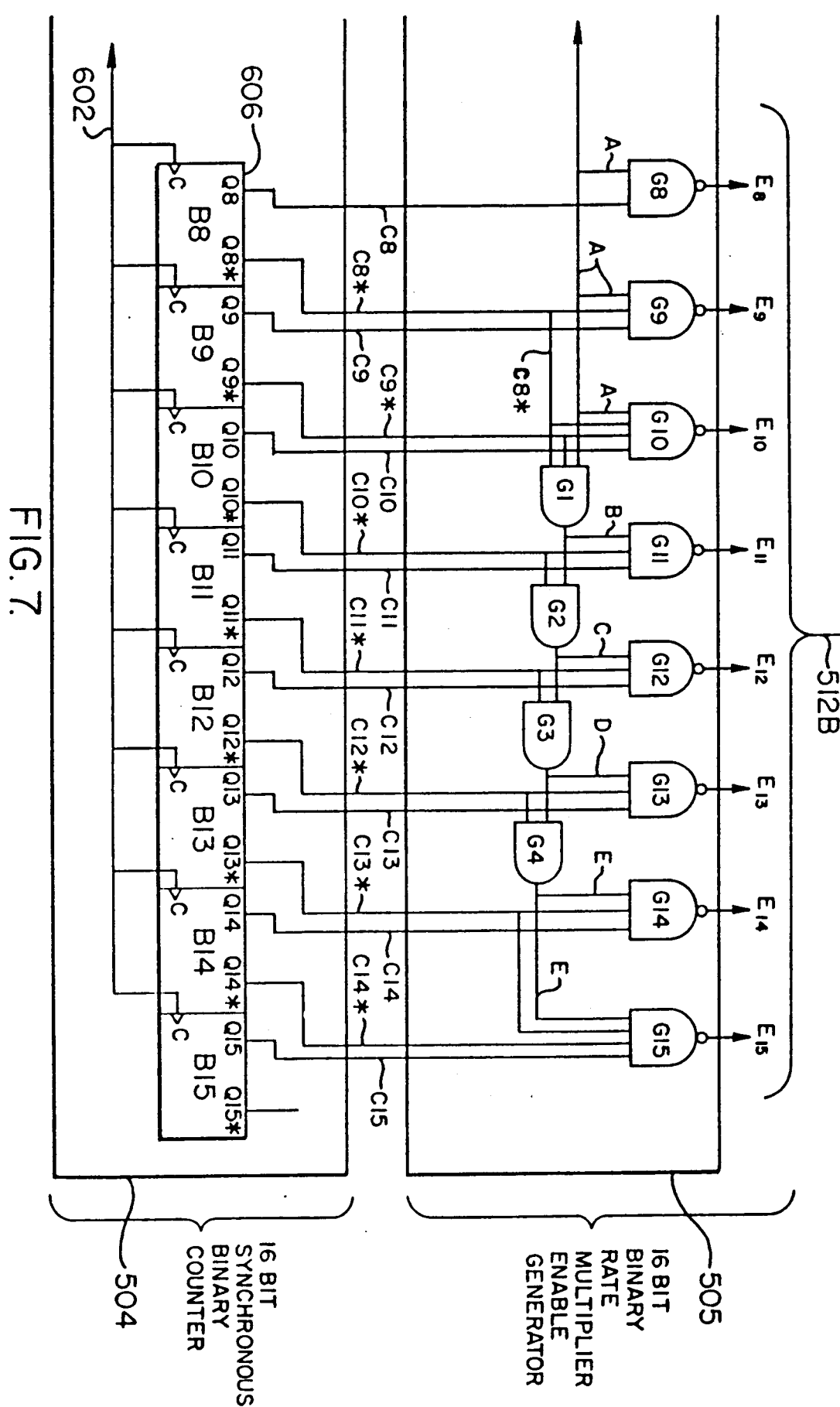

Description of FIGS. 6 and 7

FIGS. 6 and 7 disclose further details of the 16 bit binary counter 504 and the BRM enable generator 505. The refresh clock signal DACCLK is received on path 121 on FIG. 6 and is divided by ½ by element 604 which may be a master slave flip flop. Element 604 generates Q and Q* output signals that have a precise 50% duty cycle. The DACCLK*/2 signal on path 511 is the Q* output of element 604. The DAACK/2 is the Q output and is applied over path 602 as counting pulses to the c(clock) input of each section, (B0 - - - B15) of the synchronous 16 bit binary counter 504. The outputs of these counter sections are connected to associated ones of conductors C0 through C15 and C8* through C15* on FIGS. 6 and 7. The signals on paths C0 through C7 extend directly to paths E0 through E7. The signals on paths C8 through C15 extend through one or more gates on FIG. 7 to paths E8 through E15. Paths E0 through E15 comprise paths 512A and 512 on which extends from BRM enable generator 505 to the inputs of BRM element 516. All 16 of the enable pulses from the circuitry of FIGS. 6 and 7 are applied to each section of the modified BRM 516. The FIG. 8 circuitry responds to the concurrent reception of enable signals on path 512 and data bits on path 518 from latch 514 and generates the rate/width modulated output signal representing the binary value of the data bits of a word received on path 122 and subsequently stored in latch 514.

In generating the enable signals on conductors E0 through E15, the 16 bit synchronous binary counter 504 responds to the DACCLK/2 signal on path 602 and sequences through its operative states. Since this is a 16 bit counter, there are 65536 different operative states. Section B0 on the left on FIG. 6 is the least significant counter bit position. Section B15 is the most significant bit position. The outputs of the counter are applied to conductors C0 through C7 on FIG. 6 and to conductors C8 through C15 on FIG. 7 as well as to conductors C8* through C15* on FIG. 7. Conductors C0 through C7 extend directly to conductors E0 through E7 and over paths 512A and 512 to the E0 through E7 inputs on BRM element 516 on FIG. 8. Conductors C8 through C15 and C8* through C15* extend to the various gates shown on FIG. 7. The outputs of gates G8 through G15 are applied over conductors E8 through E15 and over paths 512B and 512 to the corresponding inputs on the BRM elements 516 on FIG. 8.

The operation of counter 504 generates the enable signals necessary for BRM element 516 on FIG. 8 to generate a combined rate/width modulated signal on path 519. The signal on path 519 is a rate/width modulated representation of the binary value of the data bits of a received word on path 122. This rate/width modulated signal is subsequently applied to a filter which converts it to the analog signal that is used to control a utilization device such as, for example, an instrument.

The operation of counter 504 and BRM enable generator 505 may be best understood with reference to the following table which sets forth the Boolean relationship between the signals on the E-conductors on FIGS. 6 and 7 and the corresponding state of each section of counter 504. The state of certain other specified leads on FIGS. 6 and 7 is also set forth.

TABLE 1

```
E0  = Q0
E0* = Q0*
E1  = Q1
E1* = Q1*
E2  = Q2
E2* = Q2*
E3  = Q3
E3* = Q3*
E4  = Q4
E4* = Q4*
E5  = Q5
E5* = Q5*
E6  = Q6
E6* = Q6*
E7  = Q7
E7* = Q7*
E8  = (AQ8)* = A* + Q8*
    A  = Q0Q1Q2Q3Q4Q5Q6Q7
    A* = Q0* + Q1* + Q2* + Q3* + Q4* + Q5* + Q6* + Q7*
E8  = Q0* + Q1* + Q2* + Q3* + Q4* + Q5* + Q6* + Q7* + Q8*
E8* = Q0Q1Q2Q3Q4Q5Q6Q7Q8
E9  = (AQ8*Q9)* = A* + Q8 + Q9*
E9  = Q0* + Q1* + Q2* + Q3* + Q4* + Q5* + Q6* + Q7* + Q8 + Q9*
E9* = Q0Q1Q2Q3Q4Q5Q6Q7Q8*Q9
E10 = (AQ8*Q9*Q10)* = A* + Q8 + Q9 + Q10*
E10 = Q0* + Q1* + Q2* + Q3* + Q4* + Q5* + Q6* + Q7* + Q8 + Q9 + Q10*
E10* = Q0Q1Q2Q3Q4Q5Q6Q7Q8*Q9*Q10
E11 = (BQ10*Q11)* = B* + Q10 + Q11*
    B  = AQ8*Q9* = Q0Q1Q2Q3Q4Q5Q6Q7Q8*Q9*
    B* = A* + Q8 + Q9 = Q0* + Q1* + Q2* + Q3* + Q4* + Q5* + Q6* + Q7* + Q8 + Q9
E11 = Q0* + Q1* + Q2* + Q3* + Q4* + Q5* + Q6* + Q7* + Q8 + Q9 + Q10 + Q11*
E11* = Q0Q1Q2Q3Q4Q5Q6Q7Q8*Q9*Q10*Q11
E12 = (CQ11*Q12)* = C* + Q11 + Q12*
    C  = Bq10*
    C  = Q0Q1Q2Q3Q4Q5Q6Q7Q8*Q9*Q10*
    C* = Q0* + Q1* + Q2* + Q4* + Q5* + Q6* + Q7* + Q8 + Q9 + Q10
E12 = Q0* + Q1* + Q2* + Q3* + Q4* + Q5* + Q6* + Q7* + Q8 + Q9 + Q10 + Q11 + Q12*
E12* = Q0Q1Q2Q3Q4Q5Q6Q7Q8*Q9*Q10*Q11*Q12
E13 = (DQ12*Q13)* = D* + Q12 + Q13*
    D  = CQ11*
    D  = Q0Q1Q2Q3Q4Q5Q6Q7Q8*Q9*Q10*Q11*
    D* = Q0* + Q1* + Q2* + Q3* + Q4* + Q5* + Q6* + Q7* + Q8 + Q9 + Q10 + Q11
E13 = Q0* + Q1* + Q2* + Q3* + Q4* + Q5* + Q6* + Q7* + Q8 + Q9 + Q10 + Q11 + Q12 + Q13*
E14 = (EQ13*Q14)* = E* + Q13 + Q14*
    E  = DQ12*
    E  = Q0Q1Q2Q3Q4Q5Q6Q7Q8*Q9*Q10*Q11*Q12*
    E* = Q0* + Q1* + Q2* + Q3* + Q4* + Q5* + Q6* + Q7* + Q8 + Q9 + Q10 + Q11 + Q12
E14 = Q0* + Q1* + Q2* + Q3* + Q4* + Q5* + Q6* + Q7* + Q8 + Q9 + Q10 + Q11 + Q12 + Q13 + Q14*
E14* = Q0Q1Q2Q3Q4Q5Q6Q7Q8*Q9*Q10*Q11*Q12*Q13*Q14
E15 = (EQ13*Q14*Q15)* = E* + Q13 + Q14 + Q15*
E15 = Q0* + Q1* + Q2* + Q3* + Q4* + Q5* + Q6* + Q7* + Q8 + Q9 + Q10 + Q11 + Q12 + Q13 + Q14 + Q15*
E15* = Q0Q1Q2Q3Q4Q5Q6Q7Q8*Q9*Q10*Q11*Q12*Q13*Q14*Q15
```

The BRM 516 of FIG. 8 receives the E- enable signals characterized in Table 1 and generates a rate/width modulated signal on its output lead 519 under control of the data bits received on the d-input on FIG. 8. The signals on path 125 are not dependent upon precise delays through elements 516, 505 and 504 as elsewhere described.

The output conductors on FIG. 8 are designated A, B, D, E, F, H, I and J for the column of OR gates of which gate 87 is the top most gate. These conductors extend into NAND gates 81, 82 and 83 with the outputs of these gates being designated K, G and C which extend to the inputs of OR gate 84 whose output is designated as L. The operation of these gates on the lower portion of FIG. 8 may be best characterized by the Boolean expressions set forth in the following Table 2. These gates generate the rate modulated portion of the signal on path 519.

TABLE 2

Boolean equations describing logic in FIG. 8
Modified Binary Rate Multiplier

```
A  = E15 + d0*
A* = (E15 + d0*)* = E15*d0
B  = E14 + d1*
B* = (E14 + d1*)* = E14*d1
C  = (AB)* = A* + B* = E15*d0 + E14*d1
D  = E13 + d2*
D* = (E13 + d2*)* = E13*d2
E  = E12 + d3*
E* = (E12 + d3*)* = E12*d3
F  = E11 = d4*
F* = (E11 + d4*)* = E11*d4
G  = (DEF)* = D* + E* + F*
G  = E13*d2 + E12*d3 + E11*d4
H  = E10 + d5*
H* = (E10 + d5*)* = E10*d5
I  = E9 + d6*
I* = (E9 + d6*)* = E9*d6
J  = E8 + d7*
J* = (E8 + d7*)* = E8*d7
K  = (HIJ)* = H* + I* + J*
K  = E10*d5 + E9*d6 + E8*d7
L  = C + G + K
L  = E15*d0 + E14*d1 + E13*d2 + E12*d3 + E11*d4 +
```

TABLE 2-continued

**Boolean equations describing logic in FIG. 8
Modified Binary Rate Multiplier**

E10*d5 + E9*d6 + E8*d7

Comparators 801 and 802 contribute the width modulated portion of the signal on path 519 when they receive the enable signals and data bits. Each comparator functions by determining whether the signals on its A— inputs is equal to, higher than, or lower than the signals on its B— inputs. The function of the comparators may be best expressed by the following Table 3. The top part of Table 3 indicates that A equals a 4 bit digital word on inputs A0 through A3. Also on Table 3, B equals a 4 bit digital word on inputs B0 through B3. Bit A3 is the most significant of the A bits while B3 is the most significant of the B bits.

When A is greater than B, the QA output comparator is 1, the QB output is 0 and the QAB output is 0. When the function A is less than B, the QA output is 0, the QB output is 1 and the QAB output is 0. When function A equals function B, the QA output is 0, the QB output is 0 and the QAB output is 1. The relationships indicated in Table 3 apply to comparator 802.

Table 4 indicates the relationship between the d- and E- signals applied to comparator 801 as well as the output signals generated by the comparator.

TABLE 3

For Comparators 801 and 802
Function
A = A3A2A1A0, A3 = MSB
B = B3B2B1B0, B3 = MSB

| Input Condition | QA | QB | QAB |
|---|---|---|---|
| A > B | 1 | 0 | 0 |
| A < B | 0 | 1 | 0 |
| A = B | 0 | 0 | 1 |

TABLE 4

For Comparator 802:
A0 = d8      B0 = E0
A1 = d9      B1 = E1
A2 = d10     B2 = E2
A3 = d11     B3 = E3

And
    QA1 = 1 for d11d10d9d8 > E3E2E1E0
And
    QA1 = 0 for d11d10d9d8 < E3E2E1E0
And
    QA1 = 0 for d11d10d9d8 = E3E2E1E0
where
    d11 = MSB, d8 = LSB & E3 = MSB, E0 = LSB Table 5 expresses the indicated relationships for comparator 801.

TABLE 5

For Comparator 801:
A0 = d12     B0 = E4
A1 = d13     B1 = E5
A2 = d14     B2 = E6
A3 = d15     B3 = E7

When d15d14d13d12 > E7E6E5E4
then QA2 = 1 and QAB2 = 0
When d15d14d13d12 < E7E6E5E4
then QA2 = 0 and QAB2 = 0
When d15d14d13d12 = E7E6E5E4
then QA2 = 0 and QAB2 = 1
where d15 = MSB, where d12 = LSB & E7 = MSB, E4 = LSB
Finally
BRM OUT = (QA1QAB2 + QA2 + L)*

TABLE 5-continued

BRM OUT =
(QA1QAB2+QA2+E15*D0+E14*D1+E13*D2+E12*D3+
E11*D4+E10*D5+E9*D6+E8*D7)*
and
BRM OUT* = [(QA1QAB2 + QA2 + L)*]*
BRM OUT* = QA1QAB2+QA2+L
BRM OUT* = QA1QAB2+QA2+(E15*D0+E14*D1+
E13*D2+E12*
D3+E11*D4+E10*D5+E9*D6+E8*D7)

The expression for BRM output signal on path 519 is shown on the bottom of Table 5. This signal is a function of the output of the two comparators together with the value of the signal L on path 807. From this expression may be derived the value of the output signal for any combination of input signals.

The maximum number of output pulses on a path 519 is 256 per word received on path 122. The period of the word, T(word) is the time required for counter 504 to count $2^{16}$ DAACLK/2 pulses. Since the DACCLK clock on path 121 is divided by two by element 604, $$t(\text{word}) = [2^{(16)}] \times \left( \frac{2}{\text{DACCLK frequency}} \right)$$

The period of a 16 bit D/A converted word with a 20 MHz DACCLK on path 121 is:

$$t(16) = 2^{16} \times \left( \frac{2}{20 \text{ MHz}} \right) = 6.553600 \text{ milliseconds}$$

The expression for the BRM output signal in Table 5 permits the waveform on path 519 to be derived by inserting the proper values for the D-data bits and E-enable bits. The pulse modulated signal on path 519 that represents the D-data bits of a binary word in latch 514 cannot be derived on a "one shot" instantaneous basis. Rather it must be derived by determining the 0 or 1 value of the pulse modulated signal for the entire word period of the binary rate multiplier 516. This word period is defined by the period of time it takes the 16 stage counter 504 to sequence through all of its 65,536 positions. Thus, to identify the pulse pattern on path 519 resulting from a binary word in latch 514, one must insert the values of the D-data bits of the binary word into the expression for BRM out in Table 5 and then must insert the appropriate value for the E-enable bits for each one of the 65,536 positions of counter 504. By determining the 0 or 1 value of BRM out for each of the 65,536 different patterns of the E-bits, one can determine the pulse pattern generated by the binary rate multiplier in response to the presence of the specified binary word in latch 514.

Figure 12:
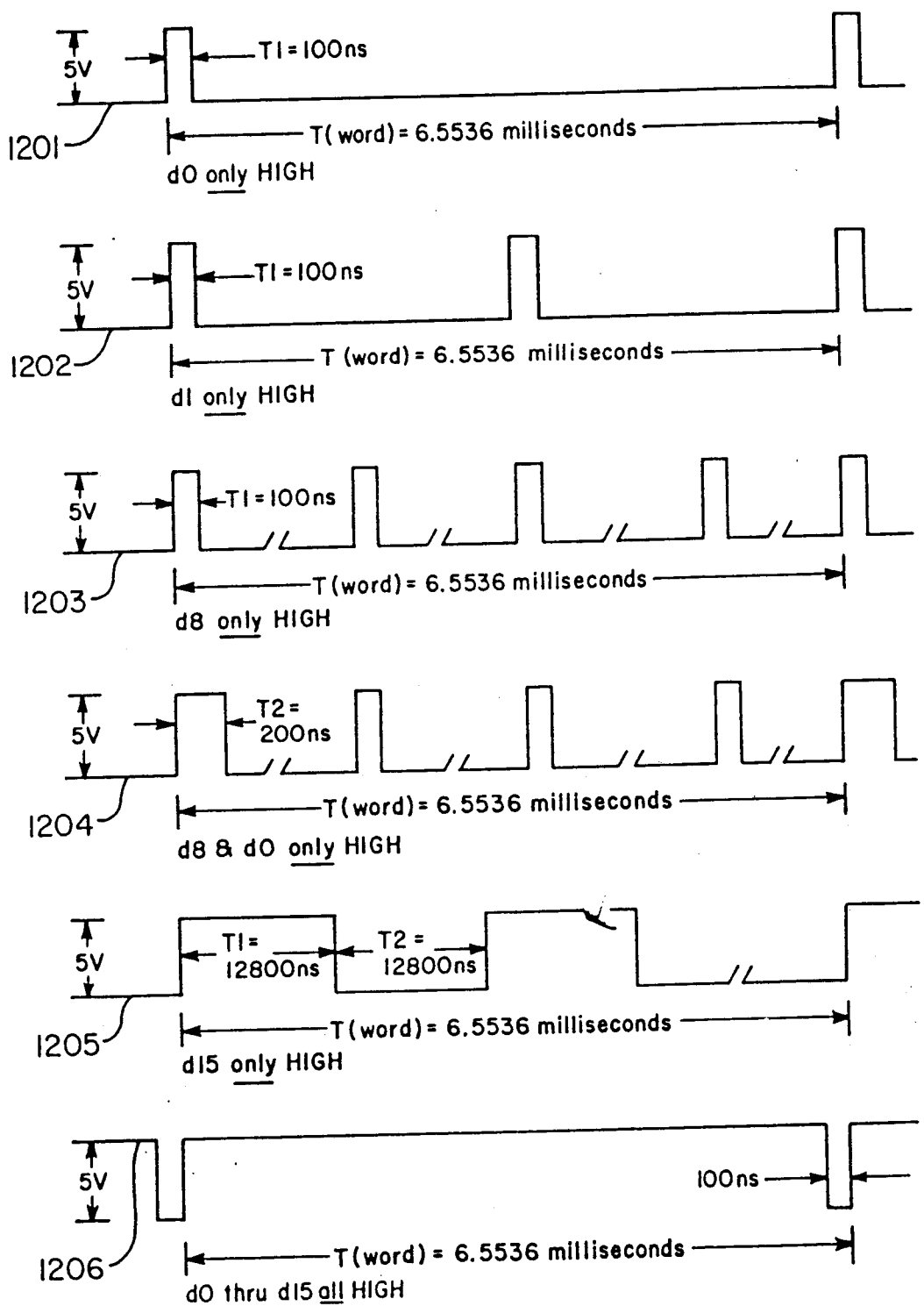
FIG. 12 illustrates with rate/width modulated signal generated by each converter in the digital portion of the circuitry of FIG. 1.

FIG. 12 shows some of the pulse outputs on path 519 with different data inputs on path 122, a 20 MHz DACCLK signal, and using a full 16 bits of data. With all 16 d- data bits of a word LOW, BRM 516 does not output any pulses on path 519 (not shown in FIG. 12). When only the LSB data bit (d0) is HIGH (line 1201) of FIG. 12, BRM 516 outputs one 5 V, 100 nanosecond pulse per T(word) period on path 519. When only data bit d1 is high (line 1202), BRM 516 outputs two 5 V, 100 nanosecond pulses per T(word) period.

For each data LSB increase, BRM 516 outputs one additional 100 nanosecond pulse per T(word) period until only data bit d8 is HIGH. With only data bit d8 HIGH (line 1203), BRM 516 outputs 256 100 nanosecond pulses (the maximum number of pulses) per T(word) period. When only data bits d8 and d0 are both HIGH (line 1204), BRM 516 outputs 255 100 nanosecond pulses and one 200 nanosecond pulse per T(word) period.

As the input data increases in binary value, one of the 256 BRM output pulses becomes 100 nanoseconds wider for each input data LSB increase. When only bit D15 is HIGH(line 1205), BRM 516 outputs 256 5 V, 12,800 nanosecond pulses per T(word) period. This is a the 50 percent duty cycle pulse output. When all input data bits d0 through d15 are HIGH (line 1206), BRM 516 outputs one 6.5535 millisecond pulse per T(word) period.

The following Table 6 further illustrates the output signals on conductors 519 for some combinations of low and high data bits received on path 122.

TABLE 6

| HIGH Input Data Bits | LOW Input Data Bits | BRM Output Pulse String Per D/C Word on Path 519 |
|---|---|---|
| none | all (d0→d15) | no pulses out |
| d0 | d1→d15 | one, 5 v, 100 ns wide pulse |
| d1 | d0 & d2→d15 | two, 5 v, 100 ns wide pulses |
| d2 | d0→d1 & d3→d15 | four, 5 v 100 ns wide pulses |
| d3 | d0→d2 & d4→d15 | eight, 5 v 100 ns wide pulses |
| d4 | d0→d3 & d5→d15 | 16, 5 v 100 ns wide pulses |
| d5 | d0→d4 & d6→d15 | 32, 5 v 100 ns wide pulses |
| d6 | d0→d5 & d7→d15 | 64, 5 v 100 ns wide pulses |
| d7 | d0→d6 & d8→d15 | 128, 5 v 100 ns wide pulses |
| d0→d7 | d8→d15 | 255, 5 v 100 ns wide pulses |
| d8 | d0→d7 & d9→d15 | 256, 5 v 100 ns wide pulses |
| d0 & d8 | d1→d7 & d9→d15 | 255, 5 v 100 ns wide pulses and one 5 v 200 ns wide pulse |
| d0→d8 | d9→d15 | one, 5 v, 100 ns wide pulse and 255, 5 v, 200 ns wide pulses |
| d9 | d0→d8 & d10→d15 | 256, 5 v 200 ns wide pulses |
| d0 & d9 | d1→d8 & d10→d15 | 256, 5 v 200 ns wide pulses and one 5 v, 300 ns wide pulse |
| d0→d7 & d9 | d8 & d10→d15 | one, 5 v, 200 ns wide pulse and 255, 5 v, 300 ns wide pulses |
| d8 & d9 | d0→d7 & d10→d15 | 256, 5 v, 300 ns wide pulses |
| d0 & d8 & d9 | d1-d7 & d10→d15 | one, 5 v, 400 ns wide pulse and 255, 5 v, 300 ns wide pulses |
| d0→d9 | d10→d15 | one, 5 v, 300 ns wide pulse and 255, 5 v, 400 ns wide pulses |
| d10 | d0→d9 & d11→d15 | 256, 5 v 400 ns wide pulses |
| d0 & d10 | d1→d9 & d11→d15 | 255, 5 v 400 ns wide pulses and one, 5 v, 500 ns wide pulse |
| d0→d7 & d10 | d8→d9 & d11→d15 | one, 5 v, 400 ns wide pulse and 255, 5 v, 500 ns wide pulses |
| d8 & d10 | d0→d7, d9 & d11→d15 | 256, 5 v, 500 ns wide pulses |
| d0 & d8 & d10 | d1→d7, d9 & d11→d15 | one, 5 v, 600 ns wide pulse and 255, 5 v, 500 ns wide pulses |
| d0→d8 & d10 | d9 & d11→d15 | one, 5 v, 500 ns wide pulse and 255, 5 v, 600 ns wide pulses |
| d9 & d10 | d0→d8 & d11→d15 | 256, 5 v, 600 ns wide pulses |
| d0 & d9 & d10 | d1→d8 & d11→d15 | one, 5 v, 700 ns wide pulse and 255, 5 v, 600 ns wide pulses |
| d0→d7 & d9→d10 | d8 & d11→d15 | one, 5 v, 600 ns wide pulse and 255, 5 v, 700 ns wide pulses |
| d8→d10 | d0→d7 & d11→d15 | 256, 5 v, 700 ns wide pulses |
| d0 & d8→d10 | d1→d7 & d11→d15 | one, 5 v, 800 ns wide pulse and 255, 5 v, 700 ns wide pulses |
| d0→d10 | d11→d15 | one, 5 v, 700 ns wide pulse and 255, 5 v, 800 ns wide pulses |
| d11 | d0→d10 & d12→d15 | 256, 5 v 800 ns wide pulses |
| d0 & d11 | d1→d10 & d12→d15 | 255, 5 v 800 ns wide pulses and one, 5 v, 900 ns wide pulse |
| d0→d7 & d11 | d8→d10 & d12→d15 | one, 5 v, 800 ns wide pulse and 255, 5 v, 900 ns wide pulses |
| d8 & d11 | d0→d7, d9→d10 & d12→d15 | 256, 5 v, 900 ns wide pulses |
| d0 & d8 & d11 | d1→d7, d9→d10 & d12→d15 | one, 5 v, 1000 ns wide pulse and 255, 5 v, 900 ns wide pulses |
| d0→d8 & d11 | d9→d10 & d12→d15 | one, 5 v, 900 ns wide pulse and 255, 5 v, 1000 ns wide pulses |
| d9 & d11 | d0→d8, d10, & d12→15 | 256, 5 v, 1000 ns wide pulses |
| d0, d9, d11 | d1→d8, d10, d12→d15 | one, 5 v, 1100 ns wide pulse and 255, 5 v, 1000 ns wide pulses |
| d0→d7, d9, d11 | d8, d10, d12→d15 | one, 5 v, 1000 ns wide pulse and 255, 5 v, 1100 ns wide pulses |
| d8, d9, d11 | d0→d7, d10 d12→d15 | 256, 5 v, 1100 ns wide pulses |
| d0, d8, d9, d11 | d1→d7, d10, d12→d15 | one, 5 v, 1200 ns wide pulse and 255, 5 v, 1100 ns wide pulses |
| d0→d9, d11 | d10, d12→d15 | one, 5 v, 1100 ns wide pulse and 255, 5 v, 1200 ns wide pulses |
| d10, d11 | d0→d9, d12→d15 | 256, 5 v, 1200 ns wide pulses |
| d0, d10, d11 | d1→d9, d12→d15 | one, 5 v, 1300 ns wide pulse and 255, 5 v, 1200 ns wide pulses |
| d0→d7, d10→d11 | d8→d9, d12→d15 | one, 5 v, 1200 ns wide pulse and 255, 5 v, 1300 ns wide pulses |
| d8, d10→d11 | d0→d7, d9, d12→d15 | 256, 5 v, 1300 ns wide pulses |
| d0, d8, d10→d11 | d1→d7, d9, d12→d15 | one, 5 v, 1400 ns wide pulses and 255, 5 v, 1300 ns wide pulses |
| d0→d8, d10→d11 | d9, d12→d15 | one, 5 v, 1300 ns wide pulse and 255, 5 v, 1400 ns wide pulses |
| d9→d11 | d0→d7, d12→d15 | 256, 5 v, 1400 ns wide pulses |
| d0, d9, d10→d11 | d1→d8, d12→15 | one, 5 v, 1500 ns wide pulse and 255, 5 v, 1400 ns wide pulses |
| d0→d7, d9→d11 | d8, d12→d15 | one, 5 v, 1400 ns wide pulses and 255, 5 v, 1500 ns wide pulses |
| d8→d11 | d0→d7, d12→d15 | 256, 5 v, 1500 ns wide pulses |
| d0, d8→d11 | d1→d7, | one, 5 v, 1600 ns wide |

TABLE 6-continued

| HIGH Input Data Bits | LOW Input Data Bits | BRM Output Pulse String Per D/C Word on Path 519 |
|---|---|---|
|  | d12→d15 | pulse and 255, 5 v, 1500 ns wide pulses |
| d0→d11 | d12→d15 | one, 5 v, 1500 ns wide pulse and 255, 5 v, 1600 ns wide pulses |
| d12 | d0→d11 & d13→d15 | 256, 5 v 1600 ns wide pulses |
| d0 & d12 | d1→d11 & d13→d15 | 255, 5 v 1600 ns wide pulses and one 5 v 1700 ns wide pulses |
| d0→d7, d12 | d8→d11, d13→d15 | one, 5 v, 1600 ns wide pulse and 255, 5 v, 1700 ns wide pulses |
| d8, d12 | d0→d7, d9→d11 d13→d15 | 256, 5 v, 1700 ns wide pulses |
| d0, d8, d12 | d1-d7, d9→d11, d13→d15 | one, 5 v, 1800 ns wide pulse and 255, 5 v, 1700 ns wide pulses |
| d0→d8, d12 | d9→d11, d13→d15 | one, 5 v, 1700 ns wide pulse and 255, 5 v, 1800 ns wide pulses |
| d9, d12 | d0→d8, d10→d11, d13→d15 | 256, 5 v, 1800 ns wide pulses |
| d0, d9, d12 | d1→d8, d10→d11, d13→d15 | one, 5 v, 1900 ns wide pulse and 255, 5 v, 1800 ns wide pulses |
| d0→d7, d12 | d8→d11, d13→d15 | one, 5 v, 1800 ns wide pulse and 255, 5 v, 1900 ns wide pulses |
| d8→d9, d12 | d0→d7, d10→d11, d13→d15 | 256, 5 v, 1900 ns wide pulses |
| d0, d8→d9, d12 | d1→d7, d10→d11, d13→d15 | one, 5 v, 2000 ns wide pulse and 255, 5 v, 1900 ns wide pulses |
| d0→d9, d12 | d10→d11, d13→d15 | one, 5 v, 1900 ns wide pulse and 255, 5 v, 2000 ns wide pulses |
| d10, d12 | d0→d9, d11 d13→d15 | 256, 5 v, 2000 ns wide pulses |
| d0, d10, d12 | d1→d9, d11, d13→d15 | one, 5 v, 2100 ns wide pulse and 255, 5 v, 2000 ns wide pulses |
| d0→d7, d10, d12 | d8→d9, d11, d13→d15 | one, 5 v, 2000 ns wide pulse and 255, 5 v, 2100 ns wide pulses |
| d8, d10, d12 | d0→d7, d9, d11, d13→d15 | 256, 5 v, 2100 ns wide pulses |
| d0, d8, d10, d12 | d1→d7, d9, d11, d13→d15 | one, 5 v, 2200 ns wide pulse and 255, 5 v, 2100 ns wide pulses |
| d0→d8, d10, d12 | d9, d11, d13→d15 | one, 5 v, 2100 ns wide pulse and 255, 5 v, 2200 ns wide pulses |
| d9→d10, d12 | d0→d8, d11, d13→d15 | 256, 5 v, 2200 ns wide pulses |
| d0, d9→d10, d12 | d1→d8, d11, d13→d15 | one, 5 v, 2300 ns wide pulse and 255, 5 v, 2200 ns wide pulses |
| d0→d7, d9→d10, d12 | d8, d11, d13→d15 | one, 5 v, 2200 ns wide pulse and 255, 5 v, 2300 ns wide pulses |
| d8→d10, d12 | d0→d7, d11, d13→d15 | 256, 5 v, 2300 ns wide pulses |
| d0, d8→d10, d12 | d1→d7, d11, d13→d15 | one, 5 v, 2400 ns wide pulse and 255, 5 v, 2300 ns wide pulses |
| d0→d10, d12 | d11, d13→d15 | one, 5 v, 2300 ns wide pulse and 255, 5 v, 2400 ns wide pulses |
| d11→d12 | d0→d10, d13→d15 | 256, 5 v, 2400 ns wide pulses |
| d0, d11→d12 | d1→d10, d13→d15 | one, 5 v, 2500 ns wide pulse and 255, 5 v, 2400 ns wide pulses |
| d0→d7, d11→d12 | d8→d10, d13→d15 | one, 5 v, 2400 ns wide pulse and 255, 5 v, 2500 ns wide pulses |
| d8, d11→d12 | d0→d7, d9→d10, d13→d15 | 256, 5 v, 2500 ns wide pulses |
| d0, d8, d11→d12 | d1→d7, d9→d10, d13→d15 | one, 5 v, 2600 ns wide pulse and 255, 5 v, 2500 ns wide pulses |
| d0→d8, d11→d12 | d9→d10, d13→d15 | one, 5 v, 2500 ns wide pulse and 255, 5 v, 2600 ns wide pulses |
| d9, d11→d12 | d0→d8, d10, d13→d15 | 256, 5 v, 2600 ns wide pulses |
| d0, d9, d11→d12 | d1→d8, d10, d13→d15 | one, 5 v, 2700 ns wide pulse and 255, 5 v, 2600 ns wide pulses |
| d0→d7, d9, d11→d12 | d8, d10, d13→d15 | one, 5 v, 2600 ns wide pulse and 255, 5 v, 2700 ns wide pulses |
| d8→d9, d11→d12 | d0→d7, d10, d13→d15 | 256, 5 v, 2700 ns wide pulses |
| d0, d8→d9, d11→d12 | d1→d7, d10, d13→d15 | one, 5 v, 2800 ns wide pulse and 255, 5 v, 2700 ns wide pulses |
| d0→d9, d11→d12 | d10, d13→d15 | one, 5 v, 2700 ns wide pulse and 255, 5 v, 2800 ns wide pulses |
| d10→d12 | d0→d9, d13→d15 | 256, 5 v, 2800 ns wide pulses |
| d0, d10→d12 | d1→d9, d13→d15 | one, 5 v, 2900 ns wide pulse and 255, 5 v, 2800 ns wide pulses |
| d0→d7, d10→d12 | d8→d9, d13→d15 | one, 5 v, 2800 ns wide pulse and 255, 5 v, 2900 ns wide pulses |
| d8, d10→d12 | d0→d7, d9, d13→d15 | 256, 5 v, 2900 ns wide pulses |
| d0, d8, d10→d12 | d1→d7, d9, d13→d15 | one, 5 v, 3000 ns wide pulse and 255, 5 v, 2900 ns wide pulses |
| d0→d8, d10→d12 | d9, d13→d15 | one, 5 v, 2900 ns wide pulse and 255, 5 v, 3000 ns wide pulses |
| d9→d12 | d0→d8, d13→d15 | 256, 5 v, 3000 ns wide pulses |
| d0, d9→d12 | d1→d8, d13→d15 | one, 5 v, 3100 ns wide pulse and 255, 5 v, 3000 ns wide pulses |
| d0→d7, d9→d12 | d8, d13→d15 | one, 5 v, 3000 ns wide pulse and 255, 5 v, 3100 ns wide pulses |
| d8→d12 | d0→d7, d13→d15 | 256, 5 v, 3100 ns wide pulses |
| d0, d8→d12 | d1→d7, d13→d15 | one, 5 v, 3200 ns wide pulse and 255, 5 v, 3100 ns wide pulses |
| d0→d12 | d13→d15 | one, 5 v, 3100 ns wide pulse and 255, 5 v, 3200 ns wide pulses |
| d13 | d0→d12 & d14→d15 | 256, 5 v 3200 ns wide pulses |
| d0 & d13 | d1→d12 & d14→d15 | 255, 5 v 3200 ns wide pulses and one 5 v 3300 ns wide pulses |
| d14 | d0→d13 & d15 | 256, 5 v 6400 ns wide pulses |
| d0 & d14 | d1-d13 & d15 | 255 5 v 6400 ns wide pulses and one 5 v 6500 ns wide pulse |
| d15 | d0→d14 | 256, 5 v, 12.8 us pulses (256, 0 v, 12.8 us slots) |
| d0, d15 | d1→d14 | 1, 5 v, 12.9 us pulse and 255, 5 v, 12.8 us pulses |
| d8, d15 | d0→d7, d8→d14 | 256, 5 v, 12.9 us pulses (256, 0 v, 12.7 us slots) |
| d0, d8, d15 | d1→d7, d8→d14 | 1, 5 v, 13.0 us pulse and 255, 5 v, 12.9 us pulses |
| d9, d15 | d1→d8, d10→d14 | 256, 5 v, 13.0 us pulses (256, 0 v, 12.6 pulses) |

TABLE 6-continued

| HIGH Input Data Bits | LOW Input Data Bits | BRM Output Pulse String Per D/C Word on Path 519 |
|---|---|---|
| d0, d9, d15 | d1→d8, d10→d14 | 1, 5 v, 13.1 us pulse and 255, 5 v, 13.0 us pulses |
| d10, d15 | d0→d9 d11→d14 | 256, 5 v, 13.2 us pulses (256, 0 v, 12.4 us slots) |
| d0, d10 d15 | d1→d9, d11→d14 | 1, 5 v, 13.3 us pulse and 265, 5 v, 13.2 us pulses |
| d11, d15 | d0→d10, d12→d14 | 256, 5 v, 13.6 us pulses (256, 0 v, 12.0 us slots) |
| d12, d15 | d0→d11 d13→d14 | 256, 5 v, 14.4 us pulses (256, 0 v, 11.2 us slots) |
| d13, d15 | d0→d12, d14 | 256, 5 v, 16.0 us pulses (256, 0 v, 8.6 us slots) |
| d14, d15 | d0→d13 | 256, 5 v, 19.2 us pulses (256, 0 v, 6.4 us slots) |
| d8, d14 d15 | d0→d7, d8→d13 | 256, 5 v, 19.3 us pulses (256, 0 v, 6.3 us slots) |
| d9, d14, d15 | d0→d8, d10→d13 | 256, 5 v, 19.4 us pulses (256, 0 v, 6.2 us slots) |
| d10, d14 d15 | d0→d8, d11→d13 | 256, 5 v, 19.6 us pulses (256, 0 v, 6.0 us slots) |
| d8→d15 | d0→d7 | 256, 5 v, 25.5 us pulses (256, 0 v, 100 ns slots) |
| d0, d8→d15 | d1→d7 | 1, 5 v, 51.1 us pulse and 254, 5 v, 25.5 us pulses (255, 0 v, 100 ns slots) |
| d1, d8→d15 | d0, d2→d7 | 2, 5 v, 51.1 us pulses and 252, 5 v, 25.5 us pulses (254, 0 v, 100 ns slots) |
| d0→d1, d8→d15 | d2→d7 | 3, 5 v, 51.1 us pulses 250, 5 v, 25.5 us pulses (253, 0 v, 100 ns slots) |
| d7→d15 | d0→d6 | 128, 5 v, 51.1 us pulses (128, 0 v, 100 ns slots) |
| d6→d15 | d0→d5 | 64, 5 v, 102.3 us pulses (64, 0 v, 100 ns slots) |
| d5→d15 | d0→d4 | 32, 5 v, 204.7 us pulses (32, 0 v, 100 ns slots) |
| d4→d15 | d0→d3 | 16, 5 v, 409.5 us pulses (16, 0 v, 100 ns slots) |
| d3→d15 | d0→d2 | 8, 5 v, 819.1 us pulses (8, 0 v, 100 ns slots) |
| d2→d15 | d0→d1 | 4, 5 v, 1.83830 ms pulses (4, 0 v, 100 ns slots) |
| d1→d15 | d0 | 2, 5 v, 3.27670 ms pulses (2, 0 v, 100 ns slots) |
| d0→d15 | none | 1, 5 v, 6.55350 ms pulse (1, 0 v, 100 ns slot) |

With all data bits HIGH, the pulse streams that result as the data bits are decremented by 1-LSB at each decrement of seven decrements are as follows:

| | | |
|---|---|---|
| d1→d15 | d0 | two, 5 v 3276700 ns wide pulses and two, 0 v 100 ns wide pulses |
| d0 & d2→d15 | d1 | one, 5 v, 3276700 ns wide pulses and two, 5 v, 1638300 ns wide pulses (three, 0 v, 100 ns pulses) |
| d2→d15 | d0→d1 | four, 5 v, 1638300 ns wide pulses (four, 0 v, 100 ns wide pulses) |
| d0→d1, d3→d15 | d2 | two, 5 v, 819100 ns wide pulses and three, 5 v, 1638300 ns wide pulses (5, 0 v, 100 ns wide pulses) |
| d1, d3→d15 | d0→d2 | four, 5 v, 819100 ns wide pulses and 2, 5 v, 1638300 ns wide pulses (6, 0 v, 100 ns wide pulses) |
| d0, d3→d15 | d1→d2 | six, 5 v, 819100 ns wide pulses and one 5 v, 1638300 ns wide pulses (7, 0 v, 100 ns wide pulses) |
| d3→d15 | d0→d2 | eight, 5 v, 819100 ns wide pulses (8, 0 v, 100 ns wide pulses) |

FIG. 12 and Table 6 each characterize the pulse waveform on path 519 in response to the reception of various patterns of data bits applied to input conductor 122. The general rule to use to 5 derive the pulse pattern (when 16 bits of data are used) for bit patterns not shown on FIG. 12 or Table 6 is that each increment of 1 in the LSB value of the input data bits from d8 only high through d8 through d15 high causes an increase in pulse width of one pulse by 100 nanoseconds. Thus, with reference to Table 6, it is specifically indicated that data bit d8 only being high produces 256 100 nanosecond wide output pulses. The next entry on the table indicates that when only data bits d0 and d8 are high, the output pulse pattern comprises 255 100 nanosecond pulses and one 200 nanosecond wide pulse. Another increment of 1 in the binary LSB value would result in bits d1 and d8 only being high and would generate 254 100 nanosecond pulses and two 200 nanosecond wide pulses. Similarly, further increments of 1 in the binary LSB value generate a pulse pattern having one less 100 nanosecond pulse and one extra 200 nanosecond pulse for each LSB increment of 1. This occurs until the bit value increases so that only bit d9 is high. At this time, as is shown on Table 6, the output is then 256 200 nanosecond wide pulses. By similar analysis and by an understanding of the above-specified relationship, the output pulse patterns may be derived in a similar manner for other combinations of data bits input above and beyond those specifically shown in Table 6.

The last entry on table 6 indicates that when all data bits are high, the output pulse pattern comprises one 5 v 6,553,500 nanosecond wide pulse. This is shown also on line 1206 in FIG. 12. The output pulse pattern that generated in response to decrements from the all data bits high condition may be derived by use of the rule that each decrement of one LSB count causes an additional 100 NS negative slot and a resulting additional pulse in the output stream. Thus, a decrement of one LSB from the all data bits high condition generates an output stream having two 5 volt output pulses each of which would have a width in nanoseconds of 3,276,700. A further decrement of 1 would generate an additional negative 100 NS slot and two 5 volt output pulses each having a width in nanoseconds of 1,638,300 and one 5 volt pulse 3,276,700 ns wide. Each further decrement in value would generate an extra 100 nanosecond negative slot and an additional pulse in the output stream. The pulse pattern on a path 519 may also be derived mathematically by use of the priorly described Boolean expressions or the output of the BRM element on FIG. 8 of path 519 at the output of NOR gate 86.

The following summarizes the operation of the binary rate modulator for an n bit data system where m data bits ($0 < m < n$) rate modulate and $n - m$ data bits width modulate. Data bits d0 through d(m−1) give rate modulation and data bits dm thru d(n−1) give width modulation. Enable bits E0 thru E(n−1) are generated by the binary rate modulator enable generator. Enable bits E(n−1) down thru E(n−m) are used to rate modulate data bits d0 thru d(m−1). Enable bit E(n−1) is combined in the binary rate modulator with data bit d0* to generate an output rate modulated pulse that occurs least often in the output word. Enable bit E(n−2) is combined in the binary rate modulator with data bit d1* to generate the output rate modulated pulse that occurs next to least often in the output word. This process continues so that:

E(n−3) is combined with d2*
E(n−4) is combined with d3*
E(n−5) is combined with d4* up until enable bit E(e−m) is combined with data bit d(m−1) in the binary rate multiplier to generate the output rate modulated pulse that occurs most often in the output word.

Enable word $$E0E1E2\ldots E\left(\frac{n-m}{4}+1\right)$$

is binary magnitude compared with data word $$dmdm+1dm+2\ldots d\left(m+\frac{n-m}{4}+1\right)$$

to give width modulation by data bits dm up thru $$d\left(m+\frac{n-m}{4}+1\right).$$

Enable word $$E\left(\frac{n-m}{4}+2\right)E\left(\frac{n-m}{4}+3\right)E\left(\frac{n-m}{4}+4\right)\ldots E(m-1)$$

is binary $$d\left(m+\frac{n-m}{4}+3\right)d\left(m+\frac{n-m}{4}+4\right)\ldots d(n-1)$$

to give width modulation by data bits $$d\left(m+\frac{n-m}{4}+2\right)$$

up thru d(n−1).

When all data words are less than each compared enable word, no width modulation occurs. When all data words are greater than each compared enable word, maximum width modulation occurs. When data bit dm only (out of data bits dm up thru dn−1) is greater than enable bit E0, minimum width modulation occurs. Intermediate width modulation occurs for all other cases of data word binary magnitude comparisons with enable words.

Summarizing, for width modulation, the BRM output on path 519 is high when d(n−1)d(n−2)d(n−3) - - - dm > E(n−m−1)E(n−m−2)E(n−m−3) - - - E0.

On FIG. 5, the output of each section of BRM element 516 is clocked through the corresponding section of the DQ flip flops 517 by the DACCLK*/2 pulse on path 511. The DQ flip flops 517 are of the clocked type in that the state of the D input of each flip flop is clocked through to its Q output whenever a rising edge clock signal on path 511 is applied to the C input of the flip flop. The clock signals on path 511 have a precise 50% duty cycle. This is not necessary, but provides the maximum digital signal processing time. These DQ flip flops provide the very precise output width control of the output pulses.

With the above-described relationships, a BRM 516 section applies a serial pulse stream over its associated output conductor 519 to the D input of its associated section of flip flop 517. The pulses of the stream are gated through the flip flop by rising edge clock signals on the C input of the flip flop. The Q* output of the flip flop is used as an output which is applied to an associated conductor 125. The different sections of flip flops 517 drive the different associated sections of interface circuit 104 which provide Q* output signals on paths 125. The output on each path 125 is the logical inverse of the combined rate/width modulated signal on path 519.

The timing and control signals used in the circuitry of the present invention eliminate the critical timing requirements of the priorly known indirect D/A converters. For example, the D/A converters disclosed by H. Schmid in Section 7.4 on pages 204 et. seq. of Electronic Analog Digital Conversion published by Van Nostrand Reinhold, New York in 1970, require extremely close signal timing and circuit signal propagation characteristics in order to function properly Contrariwise, the circuitry embodying the present invention does not require either critical circuit timing or critical circuit propagation characteristics. This may be seen from a study of FIGS. 5, 6 and 7 together with FIG. 14 which shows the timing signal on line 121, the timing signal on line 602 and the timing signal on line 511.

The DACCLK clock signal is a 20 MHZ signal and it is applied over conductor 121 to the input of flip flop 604 which divides the frequency of the signal by two and applies the divided signal to its Q* and Q outputs. The Q* output is applied over path 511 to the C (clock) input of flip flops 517. The Q output of flip flop 604 is applied over path 602 to the C (clock) input of each section of the binary synchronous sixteen section counter 504. The signal on 511 is shown on line 1403 of FIG. 14 and it has a precision fifty percent duty cycle. The signal on path 121 is shown on line 1401 and the signal on path 602 is shown on line 1402. The signal on path 511 is effective only on its rising edge, such as at times T2 and T6 on FIG. 14. At such times, the rising edge of the 511 signal clocks through each flip flop 517 the potential currently on its D input to it Q output and the inverse signal to its Q* output. The 511 signal has no affect on flip flops 517 at other times.

Recall from a prior description that each counting pulse applied over path 602 to the clock input of each section of counter 504 causes the counter to increment one position. Since this is a sixteen bit counter, it has 65536 counting positions and the time required for the counter to cycle through all of its positions in response to pulses on path 602 is 6.5536 milliseconds. This figure also represents the length of time that may be required for the associated BRM element 516 to process a received data word and apply a maximum of 256 pulses to its output conductor 519. The conductor 519 signal is applied to the D input of the associated flip flop 517.

Although it may take up to 6.5536 milliseconds for all of the pulses representing a received word to be applied by the BRM element 516 to the D input of a flip flop 517, the flip flop receives a rising edge signal on path 511 once each time that counter 504 increments in response to a pulse on path 602. Therefore, a single pulse on path 519 from the BRM element may be of sufficient width so that the high signal on path 519 representing the pulse will be strobed from the D input to the Q* output of the flip flop many times during the persistence of the pulse on path 519. This is of no concern since the flip flop output does not change state during this period and the high signal on its D input will be strobed through the flip flop and appear as a low signal on its Q* output on path 125. This signal on path 125 does not have the same width as does the input signal on path 519. The width of the signals on line 125 are precisely controlled by the 511 clock signal.

The data bits on path 122 and the DCLK clock signals on path 124 can be received at a 20 MHZ rate if desired. Since there may be 20 bits in a word including the address bits, the 20 bit word may be clocked into the register rapidly. However, elements 116 through 119 on FIG. 1, which generate the data bits and the clock signals, may be a microprocessor which controls the rate at which words are entered into the shift register 501. A high throughput of data words is not a requirement and therefore data words may be applied to path 122 at a relatively slow rate compared to the rate at which counter 504 cycles. In other words, it takes counter 504 approximately 6.5536 milliseconds (when a 20 MHZ clock is received on path 121) to cycle through all of its positions so that the associated BRM element can generate all of the pulses that are required on path 519 to represent the received digital word. Conceivably, words could be entered into shift register 501 at such a rate that there would be a new word at the input of each of the sixteen BRM sections once every 6.5536 milliseconds. However, a data throughput of this magnitude is not required and a new word may be applied to each BRM section at a far slower rate A word in the shift register 501 is transferred from the shift register to latch 514 by the DL* signal on path 123. The word remains in the latch indefinitely until the same latch section receives a subsequent word. Since this may not happen for an extended period of time, a word stored in the latch may remain there for a prolonged period of time and applied out from the latch over path 518 for a comparable prolonged period of time to the associated BRM element 516. Once every 6.553 milliseconds counter 504 cycles through all of its positions and the associated BRM element generates all of the pulses required to represent the word applied to its input. This train of pulses is applied to the D input of the associated flip flop which is clocked at a 10 MHZ rate (when a 20 MHZ clock is used on line 121) by conductor 511 so that the inverse of the pulse train appears on path 125. This pulse train on path 125 is repeated once again each subsequent 6.5536 interval that the same word remains applied to the BRM.

The modulated pulse train on path 125 is extended through interface 104 and over path 126 to the associated filter section which integrates the pulse train and converts it to a steady state analog voltage. The presence of a word in a section of latch 514 for a prolonged period of time causes the BRM element to generate a repetitive series of pulse trains representing the word. The associated filter section receives this repetitive pulse train and maintains a steady state signal at its output with the amplitude of the signal output remaining constant for the duration of time that the word remains in latch 514. In other words, once a word is entered into latch 514, the associated filter section generates an output signal which remains at a constant amplitude for the duration of time that the word remains in path 514. The output of the filter section does not change until the binary value of the word in the associated latch 514 changes.

Figure 14:
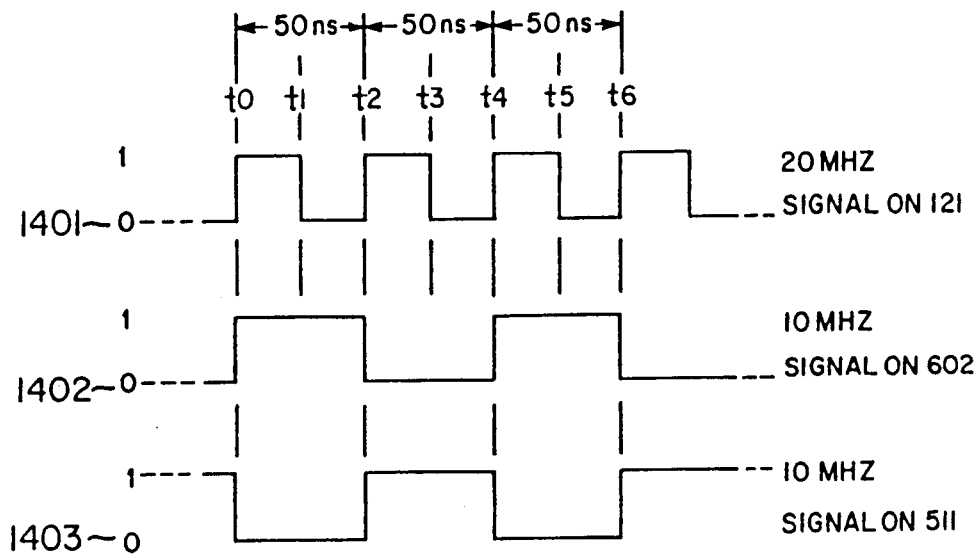
FIG. 14 illustrates the signals on conductors 121, 602 and 511.

With regard to FIG. 14, at time T0, the rising edge of the signal on path 602 increments counter 504. In the time interval between T0 and T2 all digital signal processing is completed in the binary counter 504, in the enable generator 505 and in the BRM element 516 and an appropriate logic level is on path 519 from the BRM is waiting to be clocked into flip flop 517. At time T2, the rising edge of the signal on path 511 clocks the signal on path 519 into flip flops 517. At time T4, the rising edge of the 602 signal again increments counter 504. In the time interval between T4 and T6, all digital signal processing is again completed in the binary counter 504, in the enable generator 505 and in the BRM element 516 and an appropriate logic level is once again on path 519 waiting to be clocked through flip flops 517. The signal on path 519 may or may not be the same at time T4 as it was at time T2. In many cases it will be the same, in many cases it will be different. At time T6, the rising edge of the 511 signal again clocks the signal on path 519 through to the output of flip flop 517. This process continues and creates a pulse string representing the received word out on path 106 that is representative of the data bits loaded into latch 514.

Note that the E-data bits on FIGS. 6 and 7 are generated at different times after their associated counter sections change states due to signal propagation delays through the various gates. This causes the BRM to generate pulses whose widths have an inaccuracy due to the different propagation delays of FIGS. 6 and 7. The output pulses on paths 519 extending to the D-inputs of the flip flops 517 have the same width inaccuracies. However the strobing of the flip flops by the path 511 clock signal causes an output signal pulse to be extended to the Q* output and path 125 that does not have the width inaccuracies.

It may be seen from the foregoing that the timing of the circuitry of the present invention is such that it is not critical and does not rely for successful circuit operation upon precise propagation times in the employed circuitry.

A data word may be transferred from shift register 501 to a latch section 518 immediately prior to the occurrence of a rising edge signal on path 511. This may generate a meaningless signal through to be strobed through flip flops 517. However, this only occurs for a maximum of one cycle of counter 504. This is no consequence since this signal is smoothed out by the associated filters which have a much longer time constant. Thus, the generation of a transient by BRM 516 as a new word is received close to a positive rising edge on path 511 produces no transient in the output of the associated filter If desired, the number of channels of the disclosed converter can be changed from 16 by changing the size of the output address decoder, changing the number of sections in data latches 514 and changing the number of sections in binary rate multiplier 516, changing the number of DQ flip flops 517 and changing the number of sections in interface 104.

A 16 bit wide system is described. If desired, the number of data bits per channel can be changed by changing the size of shift register 501, changing the size of each data latch 514, changing the number of elements in BRM 516 and changing the size of the synchronous binary counter 504 and the binary rate enable multiplier generator 505.

The design of the above-described circuitry can be easily modified to generate either a full rate modulated or a full width modulated pulse output string. If the BRM element of FIG. 8 were to be combined with the upper 8 data bits with the lower 8 BRM enable pulses in a straight binary rate multiplier (the same as the lower 8 data bits are combined with the upper 8 BRM enable pulses), the output of the BRM multiplier would be a full rate modulated pulse string. If the BRM element of FIG. 8 were combined with the lower 8 bits of the upper 8 enable pulses in two additional four bit magnitude comparators (similar to the way that the upper 8 data bits are combined with the lower 8 BRM enable pulses), then the final output of the binary rate multiplier would be a full width modulated pulse string.

In summary of the operation of FIG. 5, words are received serially by shift register 501, stored by the shift register, and read out of it in parallel by the DL* signal. The D- bits in the shift register are applied in parallel to the corresponding section of latch 514 under control of the A- address bits in the received word Latch 514 stores the received data bits. The stored bits are applied out of the data latch in parallel over one of paths 518 to a corresponding section of the BRM element 516 On FIG. 8, all D- bits (or their inverse) of the received data word are applied to the D- inputs of the BRM element while the enable pulses on the E- lead are applied to the E- inputs of FIG. 8. This causes the data bits on the D-inputs of FIG. 8 to be converted to a rate/width modulated pulse stream which is applied to the output path 519 of FIG. 8. This pulse stream is applied to the DQ flip flops of element 517 as a serial stream. The Q* output of the flip flop represents a corresponding inverse serial stream which is applied through interface 104 to the appropriate channel output on a path 106 of FIG. 5. The output signal on path 106 is applied to either to voltage stabilizer 102-0 or to a corresponding filter section 102-1 through 102-15 as shown on FIG. 1. The filter section smoothes out the rate/width modulated pulse stream and integrates it to provide a steady state signal having an amplitude indicative of the binary value of the received data word.

The output voltage stabilizer 102-0 senses the output of D/A converter channel 0 on path 106-0 and through a high gain negative feedback loop, regulates the positive supply on path 113-0. This output stabilizer plays a major role in setting and maintaining a high accuracy of the output signal generated by the D/A converter. The following describes how the voltage stabilizer is calibrated. With hardware calibration, a fixed data load is loaded into the control channel 0 via path 122. Potentiometer 126 controls the input voltage to the stabilizer.

A reference channel, such as channel 1, is loaded with all data bits high and the filter output from this reference channel 102-1 on path 113-1 is monitored with a high accuracy digital voltmeter. The potentiometer slider 127 is varied to cause the voltage of the reference channel 102-1 to read plus 5 volts d.c. on path 113-1. The reference channel is reloaded with all data bits low and the reading of the volt meter on path 113-1 is observed. Step 1 is repeated and the output on path 113-1 is adjusted by changing potentiometer slider 127 to read the plus 5 volts plus the voltage read on path 113-1 with all data bits low.

When one stabilizer circuit is used, the overall converter gives an approximate 0 to plus 5 volt output that may be slightly offset from 0 and plus 5 volts. This offset is quite small and is in the order of microvolts. This arrangement gives an exact 5 volt swing of the output signal. This is normally of no consequence in many applications where less than 16 data bits are used. If it is desirable to obtain an accurate absolute 0 to plus 5 volts output voltage, a second stabilizer circuit can be used to apply a regulated virtual ground. This requires the dedication of a second channel of the converter. This second channel is then calibrated for a 0 output on the virtual ground in the same manner as described for the calibration of the output of channel 0 to 5 volts.

A typical operating cycle from power-up after the circuit is calibrated is as follows:
1) The initial or resting input signal conditions are:

| DACCLK | running |
|--------|---------|
| DLN    | HIGH    |
| DATA   | don't care |
| DCLK   | HIGH    |

2) At each power-up, shift register 501 is cleared by writing the first data and address twice. (Repeat steps 3 and 4 below twice). This step is not required again until the instrument is powered down and then subsequently powered up. It is also not required if the *first channel to be loaded after power-up* is loaded with 16 *bits of data* plus the channel 0 address bits.
3) Data bits followed by four A- address bits are shifted into shift register 501 by the DCLK pulse. After all data and address bits are shifted in for any channel, the DCLK signal must be left in the HIGH state.
4) The DL* signal is cycled one time per received word. This latches the data bits into the appropriate section of data latch 514 as directed by the A- address bits on path 507. It also prepares shift register 501 to be cleared before shifting another word on path 122. The DL* signal must remain in the HIGH state after entering data into latch 514. With the DACCLK* signal running, an output is continuously produced a path 106-.

Steps 3 and 4 are repeated for each channel used.
5) The *first* D/A channel loaded with data after each power up is *always* Channel 0. This controls the Output Voltage Stabilizer circuit 102 which sets the +V voltage to Interface 104. Any channel may be used as the Control Channel if one does not wish to use channel 0. The +5 volt stabilizer is always connected to the control channel.

It should be understood that any converter channel will act as an X bit converter if that channel is loaded with X data bits where X is less than or equal to n and ny is the maximum number of data bits that the converter is designed to use.

It should be understood that any converter channel of the present invention will act as an X bit converter if that channel is loaded with X data bits where X is less than or equal to n where n is the maximum number of data bits that the converter is designed to use.

As an illustration of this type of data bit stream, assume that the converter is designed to operate with a maximum of 16 data bits. Also assume that a channel of the converter is loaded with only 7 data bits. Bit d9 now becomes the data LSB while bit d15 remains the data MSB. Data bits d0 through d8 are not used and not loaded. But they are all automatically set LOW by the converter. Now if LSB data bit d9 only is loaded with HIGH data (d10>d15 all LOW), then the output pulse stream to the associated filter is 256, 5 v, 200 ns wide pulses if a 20 MHz refresh clock (DACCLK) is used on conductor 121.

If MSB data bit d15 only is HIGH (bits d9>d14 all LOW), then the output pulse stream is 256, 5 v, 12,800 ns pulses (20 MHz DACCLK). If all data bits (d9>d15) are HIGH, then the output pulse stream is 256, 5 v, 25,400 ns pulses and 256, 0 v, 200 ns pulses with a 20 MHz DACCLK. For this case of 7 data bits, the filter output voltage will have 128 (2hu 7) steps (39.06 mv per step when a unity gain filter is used).

While a specific embodiment of this invention has been disclosed herein, it is expected that those skilled in the art can design other embodiments that differ from this particular embodiment but fall within the scope of the appended claims. For example, clock rates other than those shown herein could be used. Also, other rate/width modulation combinations could be used, such as 64 rate modulation pulses instead of 256.

We claim:

1. A multi-channel digital to analog converter comprising:
    means for entering an input word having address bits and data bits into a register,
    means for reading out said register,
    means responsive to said readout for applying said data bits of said word in said register to inputs of a multi-section latch,
    means for entering said applied data bits into a section of said latch under control of said address bits in said register,
    means for applying said data bits in said latch section to an associated section of a multi-section binary rate multiplier, said associated section of said binary rate multiplier operative in response to said application of said data bits to generate a pulse modulated signal representing the binary value of said data bits in said latch, and
    means for applying said pulse modulated signal from said binary rate multiplier to an associated section of a multi-section filter,
    said filter being responsive to said application of said pulse modulated signal to derive an analog output signal whose amplitude represents the binary value of said data bits in said latch, said output of said filter remaining at a constant amplitude as long as said data bits remain in said latch.

2. The converter of claim 1 wherein said means for applying said pulse modulated signal from said binary rate multiplier comprises:
    means for applying said pulse modulated signal from said binary rate multiplier to an associated section of a multi-section flip-flop,
    means for applying clock signals to said flip flop,
    said flip-flop operative under control of said applied clock signals for applying said pulse modulated signal to an output of said flip-flop, and
    means for applying said signal at said output of said flip-flop to said associated section of said multi-section filter.

3. The converter of claim 2 wherein said last named means for applying comprises:
    a multi-section interface,
    means for applying said signal at said output of said flip flop to an associated section of said interface, and
    means for applying said signal from said associated interface section to said associated section of said filter.

4. The converter of claim 2 wherein said means for entering said applied data bits into said latch comprises:
    an address decoder,
    means for applying said address bits read out of said register to said decoder, and
    means including said decoder responsive to the application of said address bits for controlling the latch section into which said data bits read out of said register are entered.

5. The converter of claim 1 wherein one of said channels comprises a calibration channel:
    said binary rate multiplier being responsive to the receipt of a word having address bits specifying said calibration channel for generating a pulse modulated signal comprising a calibration signal,
    an output voltage stabilizer,
    means for applying said calibration signal to said stabilizer, and
    means in said stabilizer responsive to the application of said calibration signal for controlling a supply voltage so that the amplitude of said output signal generated by said filter is a predetermined level in response to the receipt of a word whose data bits represent a predetermined binary value.

6. The converter of claim 3 wherein one of said channels comprises a calibration channel:
    said binary rate multiplier being responsive to the receipt of a word having address bits specifying said calibration channel for generating a pulse modulated signal comprising a calibration signal,
    an output voltage stabilizer,
    means for applying said calibration signal to said stabilizer, and
    means in said stabilizer responsive to the application of said calibration signal for applying a supply voltage of a controlled value to said interface so that the amplitude of an output signal generated by any of said filter sections is a predetermined level in response to the receipt of a word whose data bits represent a predetermined binary value.

7. A multichannel digital to analog converter comprising:
    an input conductor common to all channels,
    means for applying to said input conductor input words having address bits and data bits with each unique pattern of address bits specifying a unique channel of said converter,
    a shift register, means for entering each applied word into said shift register under control of pulses concurrently applied to a clock input of said shift register, means for reading out said shift register, a multi-section latch, means responsive to said readout for applying said data bits in said register to inputs of all sections of said latch, means for entering said data bits into a section of said latch under control of said address bits in said register, a multi-section binary rate multiplier of which there is one section for each section of said latch, means for applying said data bits in said latch section to an associated section of said binary rate multiplier, means in said binary rate multiplier responsive to said application of said data bits for generating a pulse modulated signal representing the binary value of said data bits in said latch, means for applying said pulse modulated signal from said binary rate multiplier to an associated section of a multi-section flip-flop, means for applying clock pulses to a clock input of said flip flop, said flip-flop being responsive to the application of said clock pulses and said pulse modulated signal for forming controlled width pulses at its output, and means for applying said controlled width output pulses formed by said flip-flop to an associated section of a multi-section filter, said filter being responsive to said application of said pulses from said flip-flop to derive an analog output signal whose amplitude represents the binary value of said data bits in said latch.

8. The converter of claim 7 wherein said last named means for applying comprises:

a multi-section interface, means for applying said signal at said output of said flip flop to an associated section of said interface, and means for applying said signal from said associated interface section to said associated section of said filter.

9. The converter of claim 7 wherein said means for entering said data bits into said latch section comprises:

an address decoder, means for applying said address bits read out of said register to said decoder, and means including said decoder responsive to the application of said address bits for controlling the latch section into which said data bits read out of said register are entered.

10. The converter of claim 7 wherein one of said channels comprises a calibration channel:

said binary rate multiplier being responsive to the receipt of a word having address bits specifying said calibration channel for generating a pulse modulated signal comprising a calibration signal, an output voltage stabilizer, means for applying said calibration signal to said stabilizer, and means in said stabilizer responsive to the application of said calibration signal for controlling a supply voltage so that the amplitude of said output signal generated by said filter is a predetermined level in response to the receipt of a word whose data bits represent a predetermined maximum binary value.

11. The converter of claim 8 wherein one of said channels comprises a calibration channel:

said binary rate multiplier being responsive to the receipt of a word having address bits specifying said calibration channel for generating a pulse modulated signal comprising a calibration signal, an output voltage stabilizer, means for applying said calibration signal to said stabilizer, and means in said stabilizer responsive to the application of said calibration signal for applying a supply voltage of a controlled value to said interface so that the amplitude of an output signal generated by any of said filter sections is a predetermined level in response to the receipt of a word whose data bits represent a predetermined maximum binary value.

12. The converter of claim 7 wherein said converter further comprises a binary counter, a binary rate multiplier enable generator, means for generating a non inverted clock signal and an inverted clock signal, means for applying said non inverted clock signal to said counter to advance said counter one counting position for each applied non inverted clock signal, means responsive to the operation of said counter in response to said application of said non inverted clock signal for applying signals from said counter to said binary rate multiplier enable generator, means in said generator responsive to said application of said signals from said counter to generate enable signals with their being a unique pattern of enable signals for each counting position of said counter, means for applying said generated enable signals to said binary rate multiplier, said binary rate multiplier being responsive to the receipt of said enable signals and said application of said data bits from said latch to generate said modulated pulse signal representing said applied data bits in said latch, and means for applying said inverted clock signal to clock inputs of said flip-flops, said flip-flops being responsive to the receipt of said inverted clock signals for strobing through said flip-flops any pulse signal then applied to said flip-flop from said binary rate multiplier so that the resultant signal on the output of said flip-flop is of a controlled width determined by the period of said inverted clock signal and the output of said binary rate multiplier.

13. The converter of claim 12 wherein said means for applying said data bits to said binary rate multiplier comprises:

means for applying the logical inverse of the lower order m bits of n bits comprising said data bits to said binary rate multiplier, and means for applying the remainder of the n bits to said binary rate multiplier in non inverted form.

14. The converter of claim 12 Wherein said means for generating comprises:

a master clock source for generating a master clock signal, a divider, and means for applying said master clock signal from said source to said divider, said divider being responsive to said receipt of said master clock signal for dividing master clock signal to generate said non inverted clock signal and said inverted clock signal.

15. The converter of claim 7 wherein the number of data bits of a received word entered into the different sections of said latch may vary in number from a minimum of 1 to a maximum of n where n is maximum bit capacity of each latch section.

16. A method of operating a multichannel digital to analog converter said method comprising the steps of:
entering an input word having address bits and data bits into a register,
reading out said register,
applying said readout data bits from said register to inputs of a multi-section latch,
entering said applied data bits into a section of said latch under control of said address bits readout of said register,
applying said data bits in said latch section to an associated section of a multi-section binary rate multiplier, said binary rate multiplier operative in response to said application of said data bits from said latch section to derive a pulse modulated signal representing the binary value of said data bits in said latch, and
applying said pulse modulated signal from an output of said binary rate multiplier to an associated section of a multi-section filter,
said filter being responsive to said application of said pulse modulated signal to derive an analog output signal whose amplitude represents the binary value of said data bits in said latch section, said output of said filter remaining at a constant amplitude as long as said data bits remain in said latch.

17. The method of claim 16 wherein said step of applying said signal to said filter comprises the steps of:
applying said pulse modulated signal from said binary rate multiplier to an associated section of a multi-section flip-flop,
said flip-flop operative for applying said pulse modulated signal to an output of said flip-flop, and
applying said signal at said output of said flip-flop to said associated section of said multi-section filter.

18. The method of claim 17 wherein said last named step of applying comprises:
applying said signal at said output of said flip flop to an associated section of a multi-section interface, and
applying said signal from said associated interface section to said associated section of said filter.

19. The method of claim 18 wherein the step of entering said readout data bits into said latch section comprises the step of:
applying said address bits readout of said register to an address decoder, said decoder being responsive to the reception of said address bits for controlling the latch section into which said data bits readout of said register are entered.

20. The method of claim 16 wherein said method further includes the steps of:
operating binary rate multiplier in response to the receipt of a word having address bits specifying a calibration channel for generating a pulse modulated signal comprising a calibration signal,
applying said calibration signal to a voltage stabilizer, and
operating said stabilizer in response to the application of said calibration signal for controlling a supply voltage so that the amplitude of said output signal generated by said filter is a predetermined level in response to the receipt of a word whose data bits represent a predetermined binary value.

21. The method of claim 18 wherein said method further comprises the steps of:
operating said binary rate multiplier in response to the receipt of a word having address bits specifying a calibration channel for generating a pulse modulated signal representing a calibration signal, and
applying said calibration signal to said an output voltage stabilizer, said stabilizer operating in response to the application of said calibration signal for applying a supply voltage to said interface so that the amplitude of an output signal generated by any of said filter sections is a predetermined level in response to the receipt of a word whose data bits represent a predetermined binary value.

22. A method of operating a multichannel digital to analog converter, said method comprising the steps of:
applying to an input conductor input words having address bits and data bits with each unique pattern of said address bits specifying a unique channel,
entering each applied word into a shift register under control of clock pulses concurrently applied to a clock input of said shift register,
reading out said shift register,
applying said data bits readout of said shift register to inputs of a multi-section latch,
entering said applied data bits into a section of said latch under control of said address bits in said applied word,
applying said data bits in said latch section to an associated section of a multi-section binary rate multiplier of which there is a section for each section of said latch,
operating said binary rate multiplier in response to the application of said data bits for applying a pulse modulated signal representing said data bits to an output of said binary rate multiplier,
applying said output signal of said binary rate multiplier to an associated section of a multi-section flip-flop, said flip-flop operative for forming controlled width pulses at its output, and
applying said formed pulses of said flip-flop to an associated section of a multi-section filter,
said filter being responsive to said application of said output pulses to derive an analog output signal whose amplitude represents the binary value of said data bits in said latch.

23. The method of claim 22 wherein said last named step of comprises the steps of:
applying said signal at said output of said flip flop to an associated section of a multi-section interface, and
extending said signal from said associated interface section to said associated section of said filter.

24. The method of claim 22 wherein the step of entering said data bits into said multi-section latch comprises the step of:
applying said address bits read out of said register to an address decoder, said decoder being responsive to the reception of said address bits for controlling the latch section into which said data bits read out of said register are entered.

25. The method of claim 22 wherein said method further includes steps of:
operating said binary rate multiplier in response to the receipt of a word having address bits specifying a calibration channel for generating a pulse modulated signal representing a calibration signal, applying said calibration signal to an output voltage stabilizer, and operating said stabilizer in response to the application of said calibration signal for generating a supply voltage so that the amplitude of said output signal generated by said filter is a predetermined level in response to the receipt of a word whose data bits represent a predetermined binary value.

26. The method of claim 23 wherein said method further includes the steps of:

operating a binary rate multiplier in response to the receipt of a word having address bits specifying a calibration channel for generating a pulse modulated signal comprising a calibration signal, applying said calibration signal to an output voltage stabilizer, and operating said stabilizer in response to the application of said calibration signal for applying a supply voltage of a controlled value to said interface so that the amplitude of an output signal generated by any of said filter sections is a predetermined level in response to the receipt of a word whose data bits represent a predetermined maximum binary value.

27. The method of claim 22 wherein said method further comprises the steps of:

generating a non inverted clock signal and an inverted clock signal, applying said non inverted clock signal to a counter to advance said counter one counting position for each generated non inverted clock signal, applying signals from said counter to a binary rate multiplier enable generator, said generator being responsive to said signals from said counter to generate enable signals with their being a unique pattern of enable signals for each counting position of said counter, applying said enable signals to said binary rate multiplier, said binary rate multiplier being responsive to the receipt of said enable signals and said application of said data bits from said latch to generate said modulated pulse signal representing said applied data bits in said latch, and applying said inverted clock signal to clock inputs of said flip-flops, said flip-flops being responsive to the receipt of said inverted clock signals for strobing through said flip-flops a pulse signal then applied to said flip-flop from said binary rate multiplier so that the resultant signal on the output of said flip-flop is of a precision width determined by the period of said inverted clock signal and the output of said binary rate multiplier.

28. The method of claim 27 wherein said step of applying said data bits to said binary rate multiplier from said latch comprises the steps of:

applying the logical inverse of the lower order m bits of the n bits comprising said data bits to said binary rate multiplier, and applying the remainder of said n bits to said binary rate multiplier in non inverted form.

29. The method of claim 27 wherein said step of generating comprises the steps of:

generating a master clock signal, and applying said master clock signal to a divider, said divider being responsive to said receipt of said master clock signal for dividing said master clock signal to generate said non inverted clock signal and said inverted clock signal.

30. The method of claim 22 wherein the number of data bits of a received word entered into the different sections of said latch may vary in number from a minimum of 1 to a maximum of n where n is the maximum bit capacity of each latch section.

31. A multi-channel digital to analog converter comprising:

a calibration and control channel and a plurality of data channels, said converter further comprising;

input means for receiving words each having address bits and data bits with said address bits of each received word specifying one of said channels, a multisection binary rate multiplier each one of whose sections is unique to a different one of said channels, means responsive to the reception of a word by said input means for applying the data bits of said received word to an input of the section of said binary rate multiplier specified by said address bits of said received word, said specified section of said binary rate multiplier operative in response to said application of said data bits of said received word to generate a unique pulse modulated signal representing the binary value of said received data bits of said received word, means for applying said generated pulse modulated signal from said specified section of said binary rate multiplier to an associated section of a multi-section filter each of whose sections is unique to a different one of said channels, an output voltage stabilizer in a section of said filter associated with said calibration and control channel, said binary rate multiplier being responsive to the receipt of a word having address bits specifying said calibration and control channel for applying said pulse modulated output signal generated by the reception of said data bits of said received word as a calibration signal to said output voltage stabilizer, and means in said stabilizer responsive to the application of said calibration signal for controlling the amplitude of supply voltage of said converter, said filter sections associated with said data channels each being responsive to said control of said supply voltage and to said application of said pulse modulated signal from an associated section of said binary rate multiplier to said each filter section to derive an analog output signal on an output of said each filter section with amplitude of said output signal representing the binary value of the data bits of a received word applied to said section of said binary rate multiplier associated with said each filter section, said analog output signal of said each filter section remaining with precision at a constant amplitude as long as said data bits remain applied to said section of said binary rate multiplier associated with said each filter section while the data bits of a received word remain applied to the input of the section of said binary rate multiplier associated with said calibration and control channel.

32. The converter of claim 31 wherein:

said binary rate multiplier is a modified binary rate multiplier; and said voltage stabilizer comprises a high gain negative feedback amplifier and a highly stable voltage reference source.

33. The converter of claim 31 wherein said converter is operable in response to the reception of a word containing less than n data bits so that the generated unique pulse modulated signal for each word is such that if m data bits of n data bits of a received word are applied to said binary rate multiplier (where m < or = to n and n is the maximum bit capacity of said converter) then the channel of said converter specified by said word automatically performs as a m bit digital to analog converter.

34. A multi-channel digital to analog converter comprising:
a calibration and control channel and a plurality of data channels, said converter further comprising;
input means for entering a received word having address bits and data bits into a register with said address bits specifying one of said channels,
means for reading out said register,
means responsive to said readout for applying said data bits of said received word in said register to inputs of a multi-section latch each section of which is unique to a different one of said channels,
means for entering said applied data bits of said received word into a section of said latch under control of said address bits in said register,
means for applying said data bits in said latch section to an associated section of a multi-section binary rate multiplier each of whose sections is unique to a different one of said channels, said associated section of said binary rate multiplier operative in response to said application of said applied data bits to generate a unique pulse modulated signal representing the binary value of said applied data bits,
means for applying said pulse modulated signal from said binary rate multiplier to an associated section of a multi-section filter each of whose sections is unique to a different one of said channels,
an output voltage stabilizer in a section of said filter associated with said calibration channel,
said binary rate multiplier being responsive to the receipt of a word specifying said calibration and control channel for applying said pulse modulated output signal generated by said binary rate multiplier in response to the reception of the data bits of said received word specifying said calibration and control channel as a calibration signal to said output voltage stabilizer,
means in said stabilizer responsive to the application of said calibration signal for controlling the amplitude of a supply voltage of said converter,
said filter sections associated with said data channels each being responsive to said control of said supply voltage and to the application of a pulse modulated signal from an associated section of said binary rate multiplier to said each filter section to derive an analog output signal on an output of said each filter section with the amplitude of said output signal representing the binary value of the data bits of a received word in an associated section of said latch associated with said each filter section,
said analog output signal of said each filter section remaining with precision at a constant amplitude as long as said data bits remain in said associated section of said latch associated with said each filter section while the data bits of a received word remain applied to the input of the section of said binary rate multiplier associated with said calibration and control channel.

35. The converter of claim 34 wherein said converter is operable in response to the reception of a word containing less than n data bits so that the generated unique pulse modulated signal for each word is such that if m data bits of n data bits of a received word are applied to said latch, (where < or = to n and n is the maximum bit capacity of said converter) then the channel of said converter specified by said word automatically performs as a m bit digital to analog converter.

36. A closed loop negative feedback controlled variable bit multi-channel digital to analog converter having n bit resolution comprising:
a calibration and control channel and a plurality of data channels, said converter further comprising;
input means for entering a received word having address bits and data bits into a register with said address bits of said received word specifying one of said channels,
means for reading out said register,
means responsive to said readout for applying said data bits of said word in said register to inputs of a multi-section latch each section of which is unique to a different one of said channels,
means for entering said applied data bits of said received word into one section of said latch under control of said address bits of said received word,
means for applying said data bits in said one latch section to an associated section of a multi-section modified binary rate multiplier each of whose sections is unique to a different one of said channels, said associated section of said binary rate multiplier operative in response to said application of said applied data bits to generate a unique pulse modulated signal representing the binary value of said applied data bits in said one section of said latch,
means for applying said pulse modulated signal from said associated modified binary rate multiplier section to an associated section of a multi-section pulse gating flip flop each of whose sections is unique to a different one of said channels, said gating flip flop operative for generating a signal having precision controlled width pulses,
means for applying said precision controlled width pulse signal from an output of said associated section of said gating flip flop to an associated section of a multisection pulse output interface circuit each of whose sections is unique to a different one of said channels, said pulse output interface circuit being operative for dynamically regulating the amplitude of said controlled width pulse signal,
a multisection integrating filter each of whose sections is unique to a different one of said channels,
a high gain negative feedback output voltage stabilizer in a section of said filter associated with said calibration and control channel,
means operative when the address bits of a received word specify said calibration and control channel for applying said dynamically regulated controlled width pulse signal from said section of said output interface circuit associated with said calibration and control channel to said calibration and control section of said integrating filter, said calibration and control section of said filter being responsive to said application of said dynamically regulated controlled width pulse signal to drive an analog output signal whose amplitude represents the binary value of said data bits of said received word whose address bits specify said calibration channel in said one latch section, p1 means for applying a highly stable reference voltage to said output voltage stabilizer, said output voltage stabilizer operative for comparing said derived analog output signal and said highly stable reference voltage to generate a controlled output voltage proportional to the difference between said derived analog output signal and said highly stable reference voltage, means operative when the address bits of a received word specify a data channel for applying said dynamically regulated controlled width pulse signal from the section of said interface circuits associated with said data channel to an associated section of said integrating filter, means for applying said controlled output voltage of said voltage stabilizer to said output interface circuits to control the amplitude of the dynamically regulated controlled width pulse signal applied by sections of said interface circuits to sections of said filter, each said filter section associated with a data channel specified by address bits of a received word being responsive to said application of said dynamically regulated controlled width pulse signal and to said application of said controlled output voltage to said each filter section to derive an analog output signal whose amplitude represents with precision the binary value of said data bits of the received word whose address bits specify said data channel in said latch, said output of said each filter section associated with said data channel remaining at a constant amplitude as long as said data bits of said received word whose address bits specify said data channel remain in said latch and as long as said highly stable reference voltage remains unchanged.

37. The converter of claim 36 wherein said converter is operable in response to the reception of a word containing less than n data bits so that the generated unique pulse signal for each word is such that if m data bits of n data bits of a received word are applied to said latch, (where m < or = to n and n is the maximum bit capacity of said converter) then the channel of said converter specified by said word automatically performs as a m bit digital to analog converter.

38. A method of operating a multi-channel digital to analog converter comprising a calibration and control channel and a plurality of data channels, said method comprising the steps of:

receiving words on an input with each word having address bits and data bits with said address bits of each received word specifying one of said channels, applying the data bits of each received word to an input of a section of a multisection binary rate multiplier specified by the address bits of said received word, each section of said binary rate multiplier being unique to a different one of said channels, said specified section of said binary rate multiplier operative in response to said application of said data bits of said received word to generate a unique pulse modulated signal representing the binary value of said received data bits of said received word, applying said generated pulse modulated signal from said specified section of said binary rate multiplier to an associated section of a multi-section filter each of whose sections is unique to a different one of said channels, said binary rate multiplier being responsive to the receipt of a word having address bits specifying said calibration and control channel for applying said pulse modulated output signal generated by the reception of said data bits of said received word as a calibration signal to an output voltage stabilizer in a section of said filter associated with said calibration and control channel, and operating said stabilizer to respond to the application of said calibration signal for controlling the amplitude of a supply voltage of said converter, said filter sections associated with said data channels each being responsive to said control of said supply voltage and to said application of said pulse modulated signal from an associated section of said binary rate multiplier to said each filter section to derive an analog output signal on an output of said each filter section with the amplitude of said output signal representing the binary value of the data bits of a received word applied to said section of said binary rate multiplier associated with said each filter section, said analog output signal of said each filter section remaining with precision at a constant amplitude as long as said data bits remain applied to said section of said binary rate multiplier associated with said each filter section while the data bits of a received word remain applied to the input of the section of said binary rate multiplier associated with said calibration and control channel.

39. The method of claim 38 wherein said converter is operable in response to the reception of a word containing less than n data bits so that the generated unique pulse modulated signal for each word is such that if m data bits of n data bits of a received word are applied to said binary rate multiplier (where m < or = to n and n is the maximum bit capacity of said converter) then the channel of said converter specified by said word automatically performs as a m bit digital to analog converter.

* * * * *